US012684966B2

(12) United States Patent
Xu et al.

(10) Patent No.: US 12,684,966 B2
(45) Date of Patent: Jul. 14, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yuanjie Xu, Beijing (CN); Weiyun Huang, Beijing (CN); Xiangdong Qin, Beijing (CN); Yu Zhang, Beijing (CN); Zhuoran Yan, Beijing (CN); Lili Du, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 554 days.

(21) Appl. No.: 18/029,118

(22) PCT Filed: May 13, 2022

(86) PCT No.: PCT/CN2022/092606
§ 371 (c)(1),
(2) Date: Mar. 29, 2023

(87) PCT Pub. No.: WO2023/216212
PCT Pub. Date: Nov. 16, 2023

(65) Prior Publication Data
US 2024/0365610 A1      Oct. 31, 2024

(51) Int. Cl.
*H10K 59/131*      (2023.01)
*H10K 59/121*      (2023.01)
*H10K 59/13*      (2023.01)

(52) U.S. Cl.
CPC ....... *H10K 59/131* (2023.02); *H10K 59/1213* (2023.02); *H10K 59/13* (2023.02); *H10K 59/1315* (2023.02)

(58) Field of Classification Search
CPC ... H10K 59/131; H10K 59/1213; H10K 59/13
See application file for complete search history.

(56) References Cited

U.S. PATENT DOCUMENTS 7,482,096 B2    1/2009   De Jonghe et al.
7,686,666 B2    3/2010   Koo et al.
(Continued)

FOREIGN PATENT DOCUMENTS

CN          1606389 A      4/2005
CN      109599053 A      4/2019
(Continued)

OTHER PUBLICATIONS

ISR and Written opinion issued Jan. 28, 2023, in corresponding International Application PCT/CN2022/120574, 14pp.
(Continued)

*Primary Examiner* — Bumsuk Won
(74) *Attorney, Agent, or Firm* — XSENSUS LLP

(57) ABSTRACT

Provided is a display panel. The display panel includes: a substrate, and a plurality of first light-emitting devices, a plurality of first pixel drive circuits, a plurality of connecting lines, a plurality of second light-emitting devices and a plurality of second pixel drive circuits disposed on the substrate. The plurality of first light-emitting devices disposed in a light-transmitting display region are coupled to the first pixel drive circuits disposed in a conventional display region through the plurality of connecting lines. An acute angle is provided between an extending direction of at least part of segments of at least one connecting line in the plurality of connecting lines and the first direction, wherein
(Continued)

the at least part of segments are disposed in the light-transmitting display region.

11 Claims, 19 Drawing Sheets

(56)                    References Cited

U.S. PATENT DOCUMENTS

| | | | |
|---|---|---|---|
| 11,227,538 | B2 | 1/2022 | Yang et al. |
| 11,456,350 | B2 | 9/2022 | Kim et al. |
| 11,527,206 | B2 | 12/2022 | Kim et al. |
| 11,532,690 | B2 | 12/2022 | Liu et al. |
| 11,538,874 | B2 | 12/2022 | Kim et al. |
| 11,568,800 | B2 | 1/2023 | Yang et al. |
| 11,758,778 | B2 | 9/2023 | Kim et al. |
| 2005/0077814 | A1 | 4/2005 | Koo et al. |
| 2006/0022583 | A1 | 2/2006 | Koo et al. |
| 2006/0028123 | A1 | 2/2006 | Koo et al. |
| 2009/0130788 | A1 | 5/2009 | Koo et al. |
| 2021/0012706 | A1 | 1/2021 | Yang et al. |
| 2021/0193755 | A1 | 6/2021 | Kim et al. |
| 2021/0193785 | A1 | 6/2021 | Kim et al. |
| 2021/0225269 | A1* | 7/2021 | Yang ................... H10K 59/121 |
| 2021/0287610 | A1 | 9/2021 | Kim et al. |
| 2021/0335987 | A1 | 10/2021 | Kim et al. |
| 2022/0037428 | A1 | 2/2022 | Lou |
| 2022/0069023 | A1 | 3/2022 | Lou et al. |
| 2022/0069052 | A1* | 3/2022 | Liu ...................... H10K 77/111 |
| 2022/0093038 | A1 | 3/2022 | Yang et al. |
| 2022/0093711 | A1* | 3/2022 | Jia ...................... H10K 59/1213 |
| 2023/0020253 | A1 | 1/2023 | Kim et al. |
| 2023/0078147 | A1 | 3/2023 | Kim et al. |
| 2023/0116094 | A1 | 4/2023 | Kim et al. |
| 2023/0127411 | A1 | 4/2023 | Liu |
| 2024/0357911 | A1* | 10/2024 | Wang ................... H10K 59/352 |

FOREIGN PATENT DOCUMENTS

| | | | |
|---|---|---|---|
| CN | 110767675 | A | 2/2020 |
| CN | 110828533 | A | 2/2020 |
| CN | 110911438 | A | 3/2020 |
| CN | 110911439 | A | 3/2020 |
| CN | 210429820 | U | 4/2020 |
| CN | 210516000 | U | 5/2020 |
| CN | 111261684 | A | 6/2020 |
| CN | 111785761 | A | 10/2020 |
| CN | 111834425 | A | 10/2020 |
| CN | 112071890 | A | 12/2020 |
| CN | 112186021 | A | 1/2021 |
| CN | 112259602 | A | 1/2021 |
| CN | 112562586 | A | 3/2021 |
| CN | 113035129 | A | 6/2021 |
| CN | 113035131 | A | 6/2021 |
| CN | 113380190 | A | 9/2021 |
| CN | 113380196 | A | 9/2021 |
| CN | 113540175 | A | 10/2021 |
| CN | 113990909 | A | 1/2022 |

OTHER PUBLICATIONS

Extended European search report of counterpart European application No. 22941166.5 issued on Jun. 2, 2025, total 12 pages.

* cited by examiner

10

DISPLAY PANEL AND DISPLAY APPARATUS

CROSS-REFERENCE TO RELATED APPLICATION

This application is a U.S. national stage of international application No. PCT/CN2022/092606, filed on May 13, 2022, the disclosure of which is incorporated herein by reference in its entirety.

TECHNICAL FIELD

The present disclosure relates to the field of display technologies, and in particular, relates to a display panel and a display apparatus.

BACKGROUND

At present, a display apparatus is generally provided with a photosensitive sensor such as an image sensor for achieving a photographing function, a biometric recognition function, or the like. A way to increase the screen-to-body ratio of the display apparatus is to place the image sensor in the display apparatus below a display panel and make a region of the display panel opposite to the image sensor still display a picture on the premise that the region has a light-transmitting function.

SUMMARY

The embodiments of the present disclosure provide a display panel and a display apparatus.

According to an aspect of the present disclosure, a display panel is provided. The display panel includes:

a substrate including a light-transmitting display region and a conventional display region, wherein the light-transmitting display region is surrounded by at least part of the conventional display region; and a plurality of first light-emitting devices disposed in the light-transmitting display region, and a plurality of first pixel drive circuits, a plurality of second pixel drive circuits, and a plurality of second light-emitting devices disposed in the conventional display region, the plurality of first pixel drive circuits being coupled to the plurality of first light-emitting devices through a plurality of connecting lines, the plurality of first pixel drive circuits being configured to drive the plurality of first light-emitting devices to emit light, the plurality of second pixel drive circuits being coupled to the plurality of second light-emitting devices, and the plurality of second pixel drive circuits being configured to drive the plurality of second light-emitting devices to emit light;

wherein the plurality of first light-emitting devices include a plurality of groups of first light-emitting devices extending along a first direction and arranged along a second direction, an acute angle is provided between an extending direction of at least part of segments of at least one connecting line in the plurality of connecting lines and the first direction, the at least part of segments being disposed in the light-transmitting display region, and the first direction and the second direction are intersected.

In some embodiments, the at least one connecting line includes a first trace, wherein the first trace includes a first segment disposed in the light-transmitting display region and a second segment disposed in the conventional display region, the first segment being connected with the second segment, the first segment being coupled to the first light-emitting device, the second segment being coupled to the first pixel drive circuit, and an angle between the first segment and the first direction being greater than 0 degree and less than 90 degrees.

In some embodiments, the angle between the first segment and the first direction is greater than 30 degrees and less than 70 degrees.

In some embodiments, the angle between the first segment and the first direction is 45 degrees.

In some embodiments, an angle between the first segment and the second segment is greater than 90 degrees.

In some embodiments, the first trace further includes a third segment disposed in the light-transmitting display region, wherein one end of the third segment is coupled to the first segment, and the other end of the third segment is coupled to the first light-emitting device; and the third segment is extended along the second direction, the second segment is extended along the first direction, and the first direction and the second direction are intersected.

In some embodiments, a length of a third segment that is coupled to a plurality of first light-emitting devices in one group of first light-emitting devices in the plurality of groups of first light-emitting devices is positively correlated to the shortest distance between the third segment and an edge of the light-transmitting display region.

In some embodiments, the at least one connecting line includes a second trace, wherein at least part of segments of the second trace that are disposed in the light-transmitting display region are parallel to the first direction.

In some embodiments, the light-transmitting display region is provided with a plurality of light-transmitting partitions, wherein at least part of the plurality of first light-emitting devices are disposed in the light-transmitting partition, the plurality of light-transmitting partitions have the same area, and the plurality of light-transmitting partitions are disposed around a center of the light-transmitting display region; and at least one connecting line in the light-transmitting partition that is coupled to the first light-emitting device is extended from the center of the light-transmitting display region to an edge of the light-transmitting display region.

In some embodiments, the light-transmitting partition includes a first sub-partition and a second sub-partition divided by a connection line between the center of the light-transmitting display region and the edge of the light-transmitting display region, wherein a connecting line of a light-emitting device disposed in the first sub-partition and a connecting line of the light-emitting device disposed in the second sub-partition are extended in different directions.

In some embodiments, the connection line between the center of the light-transmitting display region and the edge of the light-transmitting display region is a symmetry axis of the light-transmitting partition, wherein the symmetry axis is parallel to or perpendicular to the first direction.

In some embodiments, the light-transmitting partition includes a parallel connecting region and an oblique connecting region located on one side of the parallel connecting region that is distal from the center; the at least one connecting line further includes a second trace, at least part of segments of the second trace that are disposed in the light-transmitting display region being parallel to the first direction; and at least one first light-emitting device disposed in the parallel connecting region is coupled to the second trace, and at least one first light-emitting device disposed in the oblique connecting region is coupled to the first trace.

In some embodiments, the plurality of first light-emitting devices include a plurality of groups of first light-emitting devices, wherein each group of first light-emitting devices in the plurality of groups of first light-emitting devices are extended along a third direction, the plurality of groups of first light-emitting devices are arranged along a fourth direction, and the first direction, the second direction, the third direction and the fourth direction do not coincide; and one group of first light-emitting devices in the plurality of groups of first light-emitting devices include at least two light-emitting units arranged along the third direction, the light-emitting unit includes at least one first light-emitting device, and the at least two light-emitting units are coupled to the connecting lines disposed at different layers.

In some embodiments, the at least one connecting line includes a third trace, wherein the third trace includes a fourth segment, a fifth segment and a sixth segment disposed in the light-transmitting display region, and a seventh segment disposed in the conventional display region, the fourth segment, the fifth segment, the sixth segment and the seventh segment being sequentially connected, the fourth segment being coupled to the first light-emitting device, the seventh segment being coupled to the first pixel drive circuit, an angle between the fourth segment and the first direction being greater than 0 degree and less than 90 degrees, and an angle between the fifth segment and the first direction being greater than 0 degree and less than 90 degrees.

In some embodiments, an angle between the fourth segment and the fifth segment is greater than 45 degrees and less than 135 degrees. In some embodiments, the angle between the fourth segment and the fifth segment is 90 degrees.

In some embodiments, an arrangement density of the plurality of second light-emitting devices disposed in the conventional display region is the same as an arrangement density of the plurality of first light-emitting devices disposed in the light-transmitting display region.

In some embodiments, the plurality of first light-emitting devices are one-to one coupled with the plurality of first pixel drive circuits through the plurality of connecting lines.

In some embodiments, at least two first light-emitting devices in the plurality of first light-emitting devices are coupled to one first pixel drive circuit in the plurality of first pixel drive circuits through at least two of the connecting lines; or one first light-emitting device in the plurality of first light-emitting devices is coupled to at least two first pixel drive circuits in the plurality of first pixel drive circuits through at least two of the connecting lines.

According to another aspect of the present disclosure, a display apparatus is provided. The display apparatus includes: a photosensitive sensor and the display panel as defined in the above aspect, wherein an orthographic projection of a light inlet surface of the photosensitive sensor on the substrate of the display panel is at least partially disposed in the light-transmitting display region.

BRIEF DESCRIPTION OF THE DRAWINGS

For clearer illustration of the technical solutions in embodiments of the present disclosure, accompanying drawings required for describing the embodiments are briefly introduced hereinafter. It is apparent that the accompanying drawings described hereinafter merely illustrate some embodiments of the present disclosure, and those of ordinary skill in the art may derive other drawings from these accompanying drawings without creative efforts.

Figure 1:
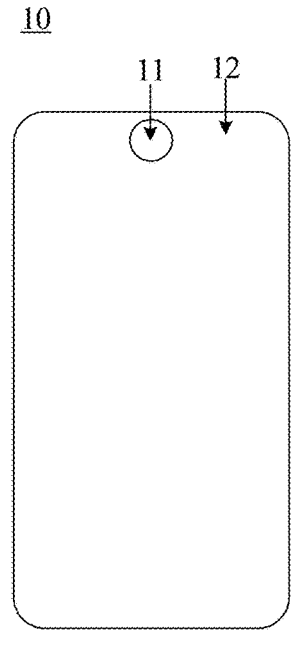
FIG. 1 is a schematic diagram of a structure of a display panel.

The explicit embodiments of the present disclosure are shown in above accompanying drawings, which will be described in detail hereafter. These accompanying drawings and text descriptions are not intended to limit scope of conception of the present disclosure, but to illustrate concept of the present disclosure to those of ordinary skill in the art with reference to specific embodiments.

DETAILED DESCRIPTION

For clearer descriptions of the objectives, technical solutions, and advantages of the present disclosure, embodiments of the present disclosure are described in detail hereinafter with reference to the accompanying drawings.

At present, the screen-to-body ratio of a display apparatus can be increased by designing a display panel in the display apparatus to be a partially light-transmitting display panel. An orthographic projection of a photosensitive surface of a photosensitive sensor in the display apparatus on the display panel is disposed in the partially light-transmitting region, and the photosensitive sensor in the display apparatus is disposed at one side opposite to a display surface of the display panel. Illustratively, the following two embodiments are adopted.

In a first embodiment, the display panel includes: a light-transmitting display region and a conventional display region. The light-transmitting display region is also referred to as a full display with camera (FDC) region. The conventional display region and the light-transmitting display region are both provided with a plurality of light-emitting devices, such that the conventional display region and the light-transmitting display region can display pictures.

The plurality of light-emitting devices disposed in the light-transmitting display region are one-to-one coupled to a part of pixel drive circuits in the conventional display region that is disposed on two sides of the light-transmitting display region, and the part of pixel drive circuits are configured to control the picture display of the light-transmitting display region.

The plurality of light-emitting devices disposed in the light-transmitting display region are connected with the plurality of pixel drive circuits in the corresponding conventional display region through a plurality of connecting lines, wherein a part of each connecting line in the plurality of connecting lines is disposed in the light-transmitting display region, and the other part of each connecting line is disposed in the conventional display region.

The light-transmitting display region is provided with a plurality of line outlets, wherein the plurality of line outlets are positions where the plurality of connecting lines connected with the plurality of light-emitting devices disposed in the light-transmitting display region are extended from the light-transmitting display region to the conventional display region, and the plurality of line outlets are disposed at positions where the light-transmitting display region is close to edges of the conventional display region that is located on two sides of the light-transmitting display region.

However, the pixel drive circuits corresponding to the light-emitting devices in the light-transmitting display region of the display panel are disposed at two sides of the light-transmitting display region, which results in a small number of line outlets of the connecting lines connected with the light-emitting devices in the light-transmitting display region, such that a space utilization rate of the conventional display region around the light-transmitting display region is low.

In a second embodiment, the display panel is provided with an display region and a peripheral region disposed at the periphery of the display region, wherein the display region includes a conventional display region and a light-transmitting display region. The conventional display region is provided with a plurality of pixel drive circuits and a plurality of light-emitting devices, wherein the pixel drive circuits in the conventional display region drive the light-emitting devices in the conventional display region in a one-to-one corresponding relationship; the light-transmitting display region is provided with a plurality of light-emitting devices therein, however, the pixel drive circuits corresponding to the light-emitting devices in the light-transmitting display region are disposed in the peripheral region, and the light-emitting devices in the light-transmitting display region are driven by the pixel drive circuits in the peripheral region. In this way, the pixel drive circuits are prevented from blocking light rays, such that the light-transmitting display region has a light-transmitting function.

However, the pixel drive circuits disposed in the peripheral region make a border of the display panel relatively large, such that the screen-to-body ratio of the display panel is relatively small, thereby resulting in a poor display effect of the display panel.

Referring to FIG. 1, FIG. 1 is a schematic diagram of a structure of a display panel. The display panel 10 includes: a light-transmitting display region 11 and a non-light-transmitting conventional display region 12.

Figure 2:
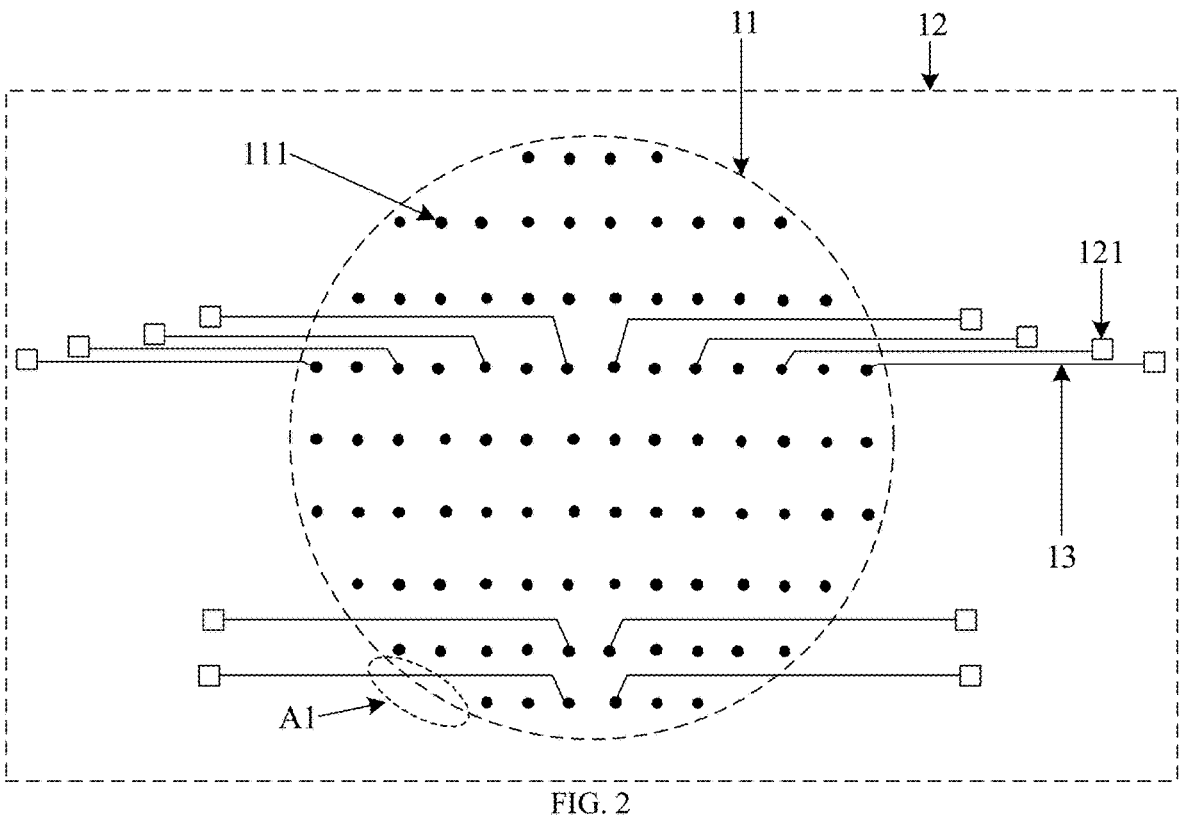
FIG. 2 is a schematic diagram of line connections of a light-transmitting display region and a conventional display region of the display panel shown in FIG. 1.

As shown in FIG. 2, FIG. 2 is a schematic diagram of line connections of the light-transmitting display region and the conventional display region of the display panel shown in FIG. 1. The light-transmitting display region 11 is provided with first light-emitting devices 111, and the conventional display region 12 is provided with first pixel drive circuits 121 coupled to the first light-emitting devices. Each of the first light-emitting devices 111 and the corresponding first pixel drive circuit 121 disposed at two sides of the light-transmitting display region 11 constitute one first pixel unit, and each of the first light-emitting devices 111 is coupled to the corresponding first pixel drive circuit 121 disposed at two sides of the light-transmitting display region 11 through a connecting line 13.

The conventional display region 12 includes not only the plurality of first pixel drive circuits 121 but also a plurality of second pixel units (not shown, the second pixel unit including a second light-emitting device and a second pixel circuit).

The light-transmitting display region 11 is provided with a plurality of line outlets A1, and a plurality of connecting lines 13 connected with a row of the first light-emitting devices 111 are extended out of the light-transmitting display region 11 through the same line outlet A1 and are extended into the conventional display region 12 disposed at two sides of the light-transmitting display region 11. The plurality of line outlets A1 are disposed at positions where the light-transmitting display region 11 is close to edges of the conventional display region 12 that is located on two sides of the light-transmitting display region.

However, extending directions of the connecting lines 13 connected with the first light- emitting devices 111 in the display panel 10 are all parallel to the row directions of the first light-emitting devices 111, wherein the first light-emitting devices 111 are disposed in the light-transmitting display region 11, such that flexibility of an arrangement of the connecting lines 13 corresponding to the first light-emitting devices 111 disposed in the light-transmitting display region 11 is low.

In addition, due to the number of the connecting lines 13 arranged in the light-transmitting display region 11 is limited by a circumference of an edge of the light-transmitting display region 11, ideally, an utilization of a trace arrangement space in the light-transmitting display region 11 is maximized by arranging the connecting lines 13 around the edge of the light-transmitting display region 11; however, as shown in FIG. 2, in a case that the connecting lines 13 connected with the first light-emitting devices 111 in the light-transmitting display region 11 are extended only in the row direction parallel to the first light-emitting devices 111, the connecting lines 13 are not arranged in the A1 region on the edge of the light-transmitting display region 11, such that a utilization of the routing space in the light-transmitting display region 11 is low.

Figure 3:
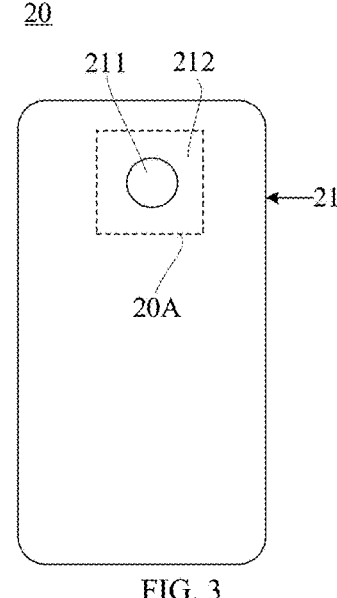
FIG. 3 is a top view of a display panel according to some embodiments of the present disclosure.
Figure 4:
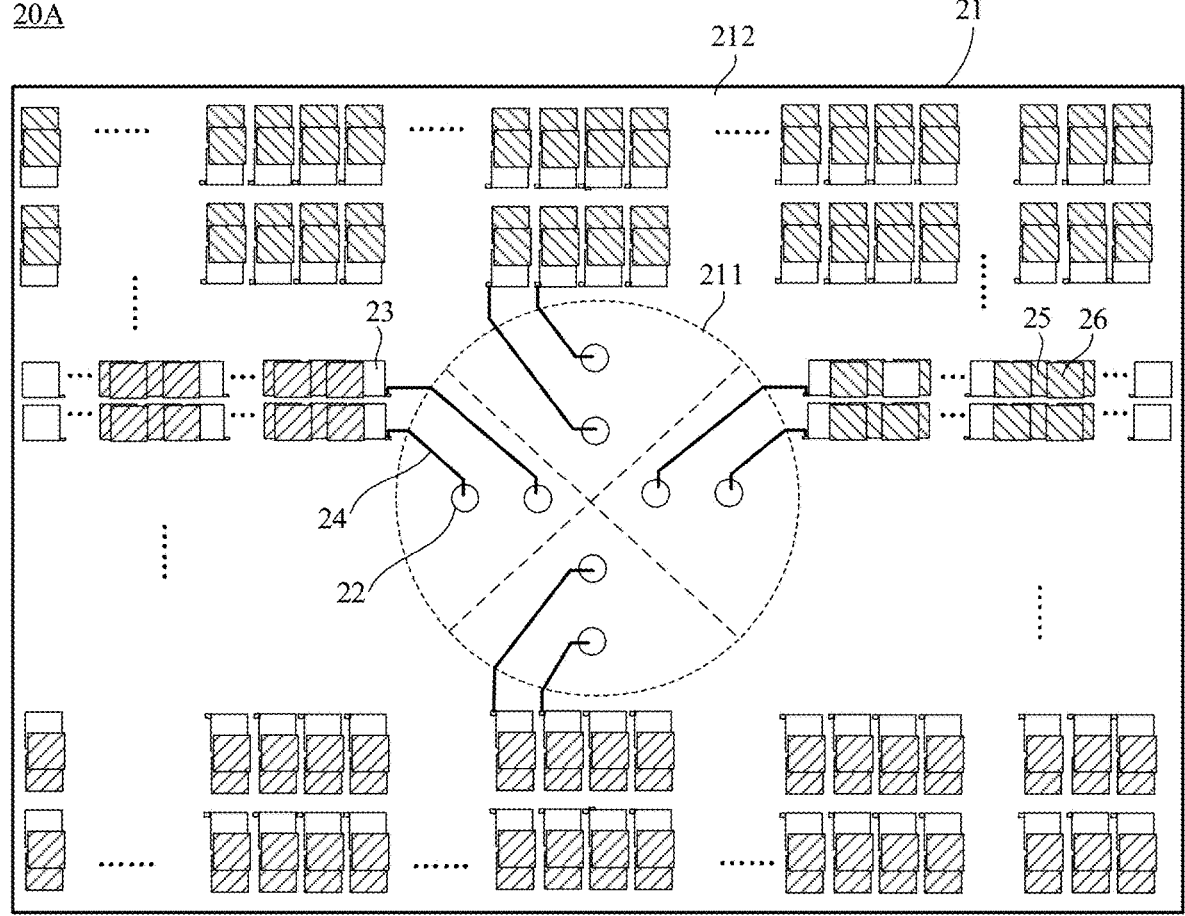
FIG. 4 is a schematic diagram of a structure of a part of the display panel shown in FIG. 3.
Figure 5:
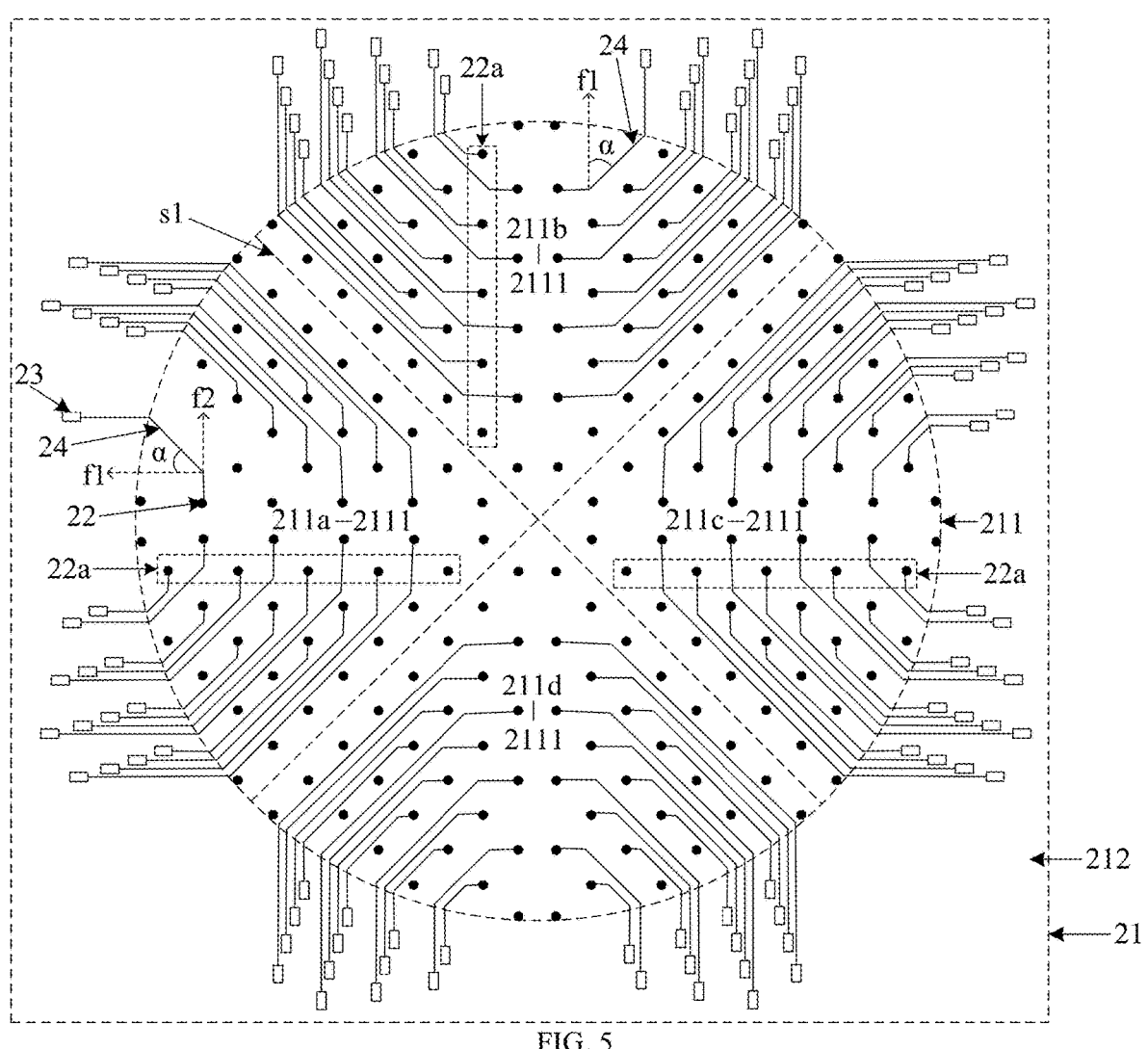
FIG. 5 is a schematic diagram of a connection structure of a first light-emitting device in a light-transmitting display region and a first pixel drive circuit in the display panel shown in FIG. 3.

FIG. 3 is a top view of a display panel according to some embodiments of the present disclosure, FIG. 4 is a schematic diagram of a structure of part 20A of the display panel shown in FIG. 3, and FIG. 5 is a schematic diagram of a connection structure of a first light-emitting device in a light-transmitting display region and a first pixel drive circuit in the display panel shown in FIG. 3. Referring to FIG. 3, FIG. 4 and FIG. 5, the display panel 20 includes: a substrate 21, a plurality of first light-emitting devices 22, a plurality of first pixel drive circuits 23, a plurality of connecting lines 24, a plurality of second pixel drive circuits 25, and a plurality of second light-emitting devices 26.

The substrate 21 is provided with a light-transmitting display region 211 and a conventional display region 212 disposed at a periphery of the light-transmitting display region 211. In some embodiments, the conventional display region 212 surrounds the light-transmitting display region 211, that is, the light-transmitting display region 211 is surrounded by the conventional display region 212. In some embodiments, the light-transmitting display region 211 is disposed at other positions, and the position where the light-transmitting display region 211 is disposed is determined as needed. For example, the light-transmitting display region 211 is disposed at a top middle position of the substrate 21, or disposed at an upper left corner or an upper right corner of the substrate 21. In some embodiments, hardware such as a photosensitive sensor (e.g., a camera) is disposed in the light-transmitting display region 211 of the display panel 20. The light-transmitting display region 211 is a circle as shown in FIG. 3, or a square, a hexagon, a trapezoid, or other shapes, which is not limited in the embodiments of the present disclosure.

The plurality of first light-emitting devices 22 are disposed in the light-transmitting display region 211, the plurality of first pixel drive circuits 23 are disposed in the conventional display region 212, the plurality of connecting lines 24 are disposed on the substrate 21, and a part of each of the connecting lines 24 is disposed in the light-transmitting display region 211, and the other part is disposed in the conventional display region 212. That is, the plurality of connecting lines 24 coupled to the light-emitting devices 22 disposed in the light-transmitting display region 211 are extended out of the light-transmitting display region 211 through an edge of the light-transmitting display region 211 and are extended into the conventional display region 212 around the light-transmitting display region 211. The plurality of first pixel drive circuits 23 are coupled to the plurality of first light-emitting devices 22 through the plurality of connecting lines 24, and the plurality of first pixel drive circuits 23 are configured to drive the plurality of first light-emitting devices 22 to emit light.

The plurality of second light-emitting devices 26 and the plurality of second pixel drive circuits 25 are disposed in the conventional display region 212. The plurality of second pixel drive circuits 25 are coupled to the plurality of second light-emitting devices 26, and the plurality of second pixel drive circuits 25 are configured to drive the plurality of second light-emitting devices 26 to emit light.

The plurality of first light-emitting devices 22 include a plurality of groups of first light-emitting devices 22a extending along a first direction f1 and arranged along a second direction f2. An acute angle α is provided between an extending direction of at least part of segments of at least one connecting line 24 in the plurality of connecting lines 24 and the first direction f1, wherein the at least part of segments are disposed in the light-transmitting display region 211. The first direction f1 and the second direction f2 are intersected.

It should be noted that, as shown in FIG. 5, the first direction f1 does not refer to a certain absolute direction. Since the light-transmitting display region 211 is surrounded by the conventional display region 212, the plurality of first pixel drive circuits 23 are disposed around the light-transmitting display region 211. In some embodiments, the plurality of first pixel drive circuits 23 are disposed around the plurality of first light-emitting devices 22, and the first direction f1 refers to a row direction or a column direction of the plurality of first light-emitting devices 22 shown in FIG. 4. In some embodiments, the light-transmitting display region 211 shown in FIG. 5 includes four light-transmitting partitions 2111 arranged around a center of the light-transmitting display region 211 (the four light-transmitting partitions 2111 includes a first light-transmitting partition 211a, a second light-transmitting partition 211b, a third light-transmitting partition 211c, and a fourth light-transmitting partition 211d). In some embodiments, arrangements of the connecting lines 24 in the first light-transmitting partition 211a and the second light-transmitting partition 211b are symmetrical along a symmetry axis s1 of the light-transmitting display region 211, an angle between the symmetry axis s1 and the first direction f1 is 45 degrees, and the first directions f1 in the first light-transmitting partition 211a and the second light-transmitting partition 211b are symmetrical along the symmetry axis s1. In some embodiments, as the first direction f1 in the first light-transmitting partition 211a is the row direction of the plurality of first light-emitting devices 22, the first direction f1 in the second light-transmitting partition 211b is the column direction of the plurality of first light-emitting devices 22. In the embodiments of the present disclosure, the first light-transmitting partition 211a is taken as an example for illustration, arrangements of the connecting lines 24 in other light-transmitting partitions are symmetrical to the arrangement of the connecting lines 24 in the first light-transmitting partition 211a along the symmetry axes of the light-transmitting display region 211.

In this way, the extending direction of at least one connecting line 24 is flexibly adjusted by setting up the value of the acute angle α, and a plurality of connecting lines 24 are flexibly arranged, such that the flexibility of the arrangement of the plurality of connecting lines 24 on the display panel 20 is relatively high.

For convenience of distinguishing the light-transmitting display region 211 from the conventional display region 212, the light-emitting devices at the boundary between the light-transmitting display region 211 and the conventional display region 212 are not completely shown in FIG. 4 and FIG. 5. In an actual display panel, the boundary between the light-transmitting display region 211 and the conventional display region 212 is provided with a plurality of light-emitting devices, and the plurality of light-emitting devices belong to the light-transmitting display region 211 or the conventional display region 212.

For example, the part of each of the connecting lines 24 disposed in the light-transmitting display region 211 is made of a light-transmitting conductive material. Thus, the light transmittance of the light-transmitting display region 211 is improved. The manufacturing process of the connecting line 24 is simplified by manufacturing the whole connecting line 24 with a light-transmitting conductive material. In some embodiments, the light-transmitting conductive material is indium tin oxide (ITO).

In summary, a display panel is provided in the embodiments of the present disclosure. The display panel includes: a substrate, and a plurality of first light-emitting devices, a plurality of first pixel drive circuits, a plurality of connecting lines, a plurality of second light-emitting devices and a plurality of second pixel drive circuits disposed on the substrate. The plurality of first light-emitting devices disposed in the light-transmitting display region are coupled to the first pixel drive circuits disposed in the conventional display region through the plurality of connecting lines. An acute angle is provided between an extending direction of at least part of segments of at least one connecting line in the plurality of connecting lines and the first direction, wherein the at least part of segments are disposed in the light-transmitting display region. In this way, the plurality of connecting lines are flexibly arranged by setting up the value of the acute angle, such that the arrangement of the plurality of connecting lines on the display panel is relatively flexible. The problem that the flexibility of the arrangement of the connecting lines corresponding to the first light-emitting devices disposed in the light-transmitting display region is low in the related art is solved, and the effect of improving the flexibility of the arrangement of the connecting lines corresponding to the first light-emitting devices disposed in the light-transmitting display region is achieved.

It should be noted that FIG. 4 and FIG. 5 only show the routing of the connecting lines 24 corresponding to a part of the first light-emitting devices 22 in the plurality of first light-emitting devices 22 disposed in the light-transmitting display region 211. The routing of the connecting line 24 corresponding to at least one of other first light-emitting devices 22 disposed in the light- transmitting display region 211 is similar to this routing.

In some embodiments of the present disclosure, the first light-emitting device 22 and the second light-emitting device 26 are organic light-emitting diode (OLED) light-emitting devices. In some embodiments, the light-emitting device 22 includes: a first electrode, a light-emitting material layer, and a second electrode stacked along a direction perpendicular to and distal from the substrate 21. In some embodiments, the first electrode is an anode of the light-emitting device 22, the second electrode is a cathode of the light-emitting device 22, and the cathode is a whole-layer structure.

In some embodiments, the first electrode in the first light-emitting device 22 is coupled to a corresponding pixel drive circuit through the connecting line 24 by being coupled to the connecting line 24. The first light-emitting device 22 in FIG. 5 indicates the first light-emitting device 22 by a connection position of the first light-emitting device 22. The connection position is referred to a connection position of the first electrode of the first light-emitting device 22 and the connecting line 24.

Figure 6:
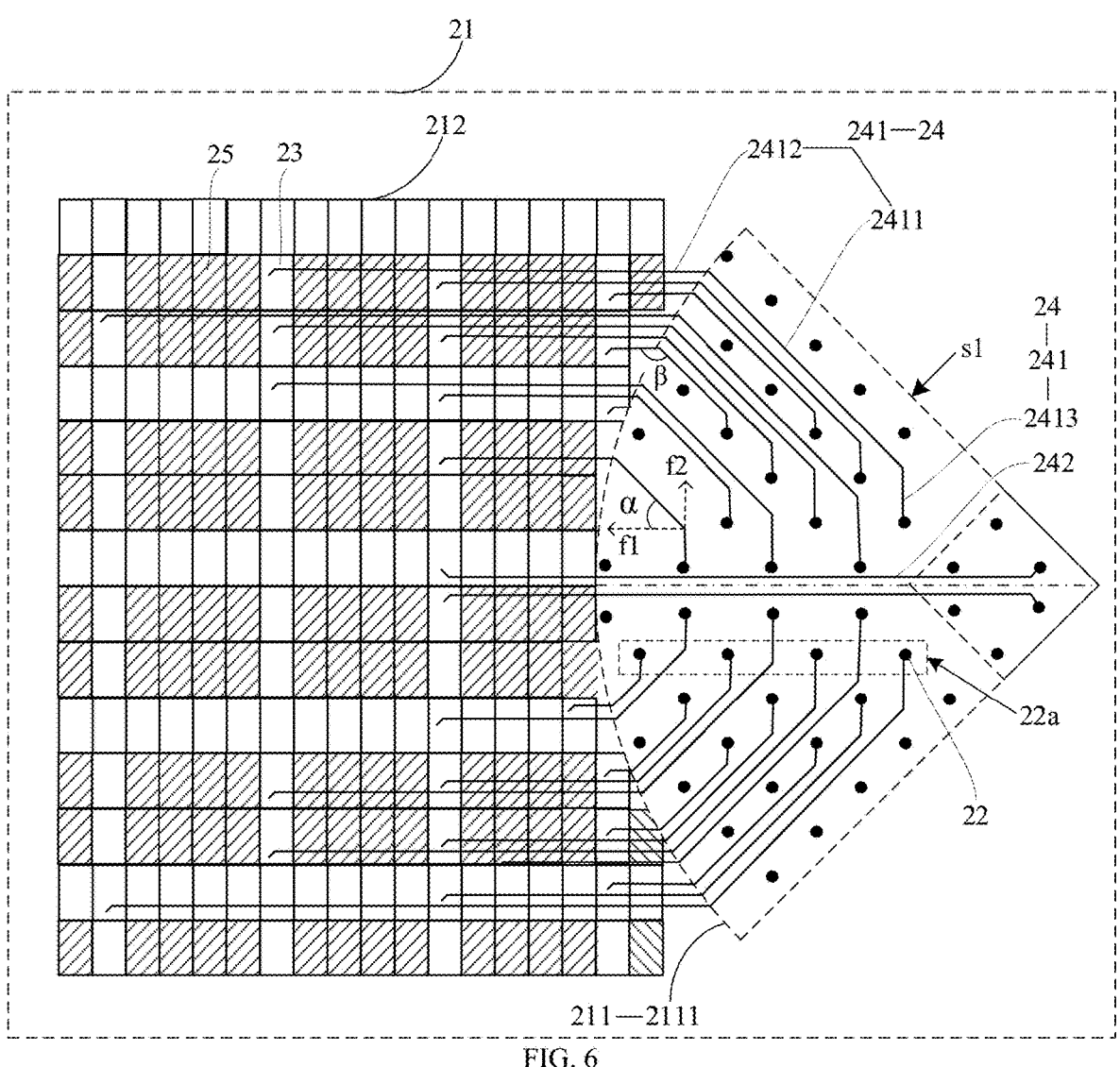
FIG. 6 is a schematic diagram of a structure of a connecting line of a light-transmitting partition according to some embodiments of the present disclosure.

In some embodiments, as shown in FIG. 6, FIG. 6 is a schematic diagram of a structure of a connecting line of a light-transmitting partition according to some embodiments of the present disclosure. For convenience of indicating the connections of the plurality of first light-emitting devices 22, only one light-transmitting partition 2111 in the plurality of light-transmitting partitions 2111 is shown in FIG. 6, and the connections of the other light-transmitting partitions 2111 is the same as the connections of the light-transmitting partition 2111 shown in FIG. 6. The plurality of first light-emitting devices 22 are one-to-one coupled to the plurality of first pixel drive circuits 23 through the plurality of connecting lines 24. That is, one end of each of the connecting lines 24 is coupled to one first light-emitting device 22 disposed in the light-transmitting display region 211, and the other end is coupled to one first pixel drive circuit 23 disposed in the conventional display region 212. Thus, each of the first light-emitting devices 22 is coupled to one first pixel drive circuit 23 through one connecting line 24.

In some embodiments, at least two first light-emitting devices 22 in the plurality of first light-emitting devices 22 are coupled to one first pixel drive circuit 23 in the plurality of first pixel drive circuits 23 through at least two connecting lines 24. That is, one end of at least two connecting lines 24 are one-to-one coupled to at least two first light-emitting devices 22 disposed in the light-transmitting display region 211, and the other end of the at least two connecting lines 24 are coupled to one first pixel drive circuit 23 disposed in the conventional display region 212. Thus, the plurality of first light-emitting devices 22 are coupled to one first pixel drive circuit 23 through the plurality of connecting lines 24. The plurality of first light-emitting devices 22 is driven by one first pixel drive circuit 23.

Or, one first light-emitting device 22 in the plurality of first light-emitting devices 22 is coupled to at least two first pixel drive circuits 23 in the plurality of first pixel drive circuits 23 through at least two connecting lines 24. Thus, the first light-emitting device 22 is coupled to the plurality of first pixel drive circuits 23 through the plurality of connecting lines 24. One first light-emitting device 22 is driven by the plurality of first pixel drive circuits 23.

In an optional embodiment, as shown in FIG. 6, at least one connecting line 24 includes a first trace 241. The first trace 241 includes a first segment 2411 disposed in the light-transmitting display region 211 and a second segment 2412 disposed in the conventional display region 212, the first segment 2411 is connected with the second segment 2412, the first segment 2411 is coupled to the first light-emitting device 22, the second segment 2412 is coupled to the first pixel drive circuit 23, and an angle $\alpha$ between the first segment 2411 and the first direction f1 is greater than 0 degree and less than 90 degree. Or, the angle between the first segment 2411 and the first direction f1 is greater than 30 degrees and less than 70 degrees. In this way, a plurality of first segments 2411 are flexibly arranged by setting up the value of the angle $\alpha$ between the first segment 2411 and the first direction f1, such that the arrangement of the plurality of first segments 2411 on the display panel is relatively flexible.

In some embodiments, the angle between the first segment 2411 of the first trace 241 and the first direction f1 is 45 degrees, such that routing of first segments 2411 of the plurality of first traces 241 disposed in the light-transmitting display region 211 is uniform and regular.

In some embodiments, an angle $\beta$ between the first segment 2411 of the first trace 241 and the second segment 2412 of the first trace 241 is greater than 90 degrees. For example, the angle $\beta$ between the first segment 2411 of the first trace 241 and the second segment 2412 of the first trace 241 is 145 degrees. In this way, the second segment 2412 disposed in the conventional display region 212 is extended along a direction distal from the light-transmitting display region 211, thereby being coupled to the first pixel drive circuit 23 disposed in the conventional display region 212.

In an optional embodiment, the first trace 241 further includes a third segment 2413 disposed in the light-transmitting display region 211, wherein one end of the third segment 2413 is coupled to the first segment 2411, and the other end of the third segment 2413 is coupled to the first light-emitting device 22. Because the plurality of first segments 2411 are arranged in parallel along a direction perpendicular to the first segments 2411 in the light-transmitting display region 211, and the plurality of first light-emitting devices 22 coupled to the plurality of first segments 2411 are arranged in a row in an extending direction of the first segments 2411, distances between the plurality of first segments 2411 arranged in parallel along the direction perpendicular to the first segments 2411 and the coupled plurality of first light-emitting devices 22 are different. The plurality of first segments 2411 are prevented from overlapping in a direction perpendicular to the substrate 21 by one-to-one coupling the plurality of first segments 2411 to the plurality of first light-emitting devices 22 through the plurality of third segments 2314. The third segments 2413 are extended along a second direction f2.

The second segment 2412 is extended along the first direction f1, the first direction f1 and the second direction f2 are intersected. Further, the first direction f1 and the second direction f2 are perpendicular to each other.

In some embodiments, as shown in FIG. 6, a length of a third segment 2413 that is coupled to a plurality of first light-emitting devices 22 in one group of first light-emitting devices 22a in the plurality of groups of first light-emitting devices 22a is positively correlated to the shortest distance between the third segment 2413 and an edge of the light-transmitting display region 211. That is, the length of the third segment 2413 is shorter and shorter along a direction from the center of the light-transmitting display region 211 to the edge of the light-transmitting display region 211.

In some embodiments, as shown in FIG. 6, at least one connecting line 24 further includes a second trace 242, wherein at least part of segments of the second trace 242 that are disposed in the light-transmitting display region 211 are parallel to the first direction f1. That is, the plurality of connecting lines 24 coupled to the first light-emitting devices 22 disposed in the light-transmitting display region 211 include a first trace 241 whose extending direction of at least part of segments has the acute angle α with the first direction f1, and further include a second trace 242 whose extending direction of at least part of segments is parallel to the first direction f1. The flexibility of routing of the connecting lines 24 corresponding to the first light-emitting devices 22 disposed in the light-transmitting display region 211 is further improved. In some embodiments, the second trace 242 is arranged in the routing space where the first trace 241 is not arranged, such that the routing space in the light-transmitting display region 211 on the display panel 20 is reasonably utilized.

Figure 7:
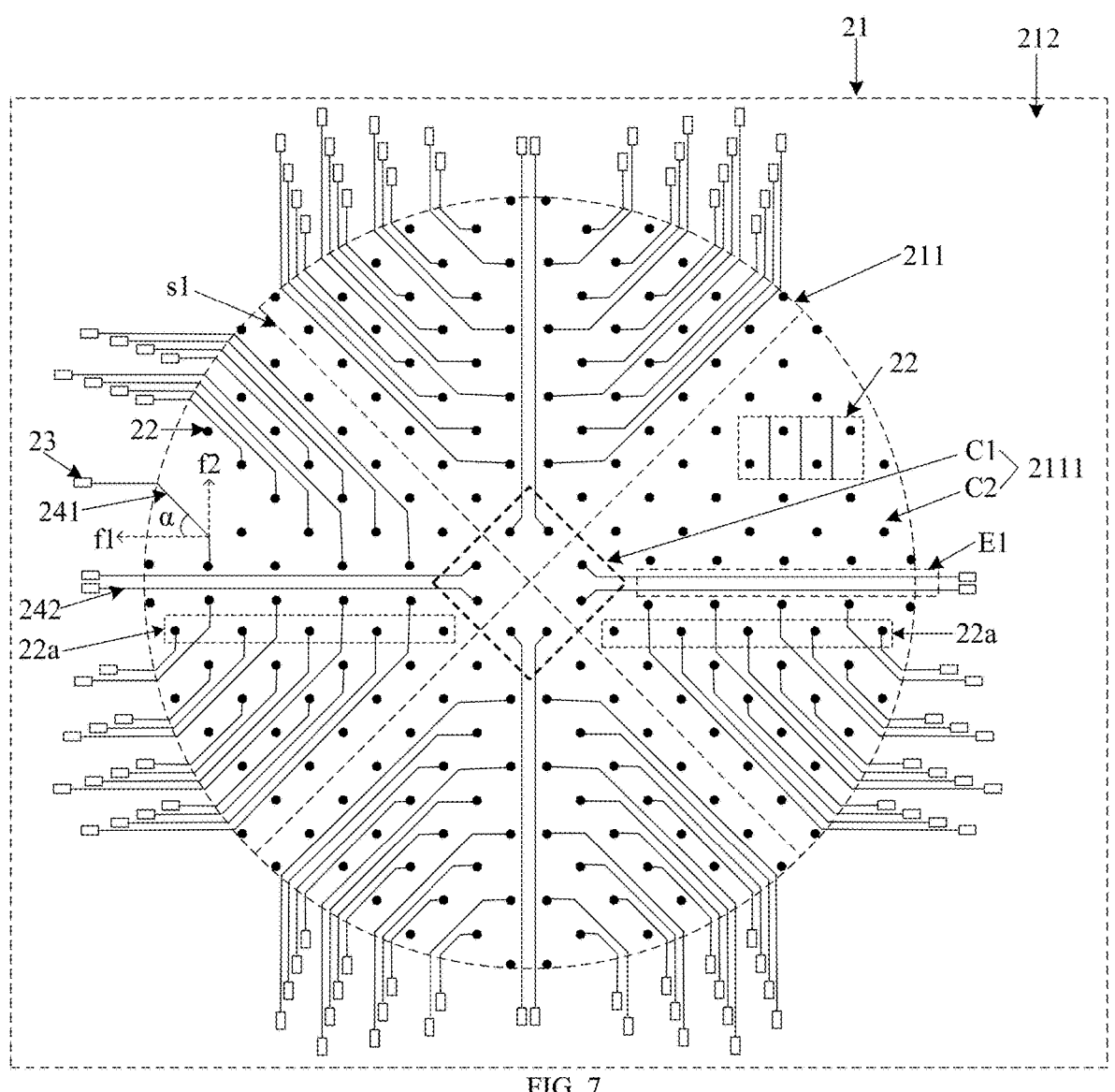
FIG. 7 is a schematic diagram of a structure of a light-transmitting display region according to some embodiments of the present disclosure.

In some embodiments, as shown in FIG. 7, FIG. 7 is a schematic diagram of a structure of a light-transmitting display region according to some embodiments of the present disclosure. The plurality of connecting lines 24 corresponding to the plurality of first light-emitting devices 22 disposed in the light-transmitting display region 211 are extended out of the light-transmitting display region from the edge of the light-transmitting display region 211. Referring to FIG. 7, the connecting lines 24 are arranged around the edge of the light-transmitting display region 211, such that the utilization rate of the routing space in the light-transmitting display region 211 is relatively high.

Figures 8, 9:
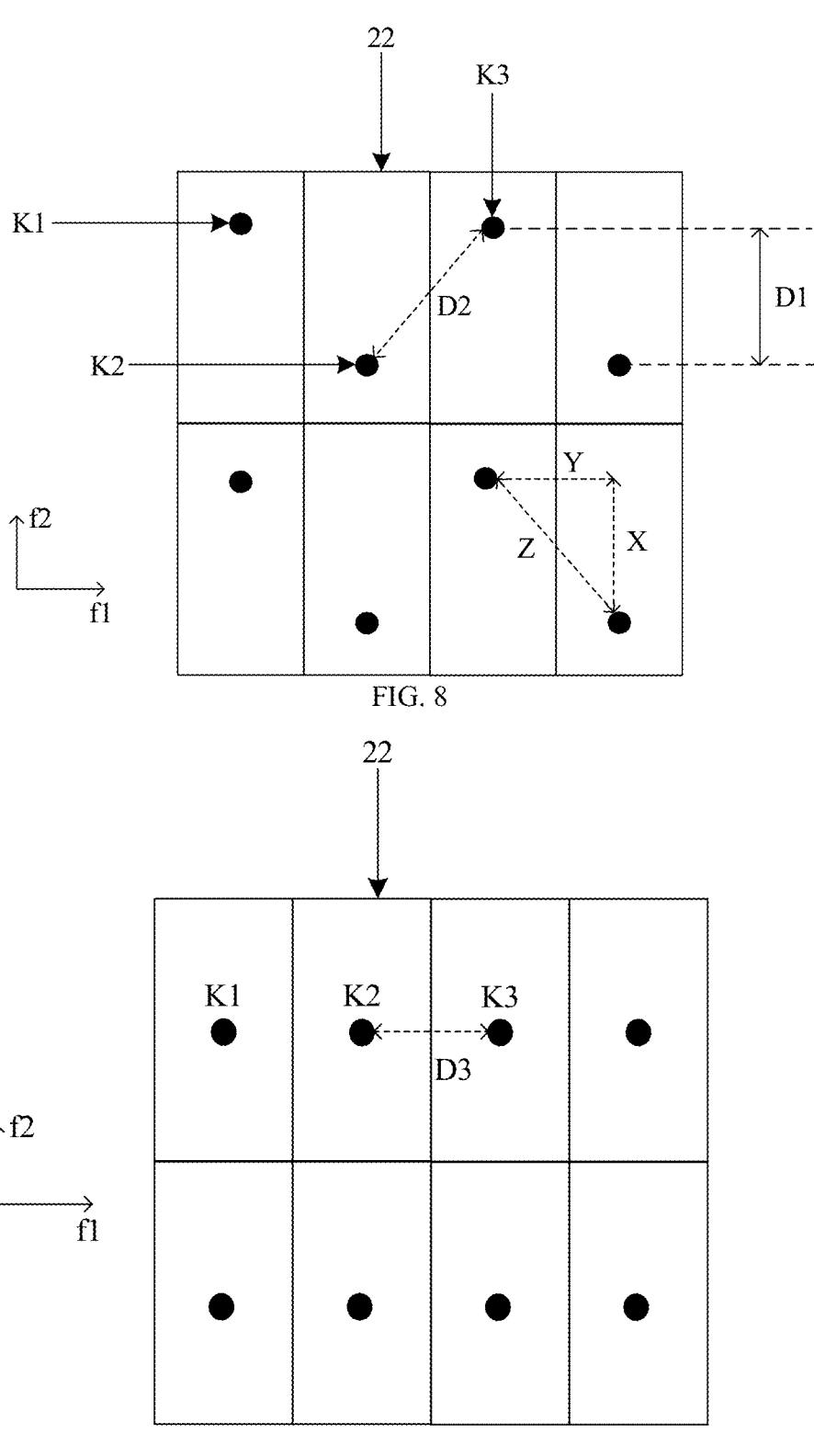
FIG. 8 is a schematic diagram of a structure of a first light-emitting device in the display panel shown in FIG. 7 that is disposed in a light-transmitting display region.
FIG. 9 is a schematic diagram of a structure of a first light-emitting device.

In some embodiments, as shown in FIG. 8, FIG. 8 is a schematic diagram of a structure of a first light-emitting device in the display panel shown in FIG. 7 that is disposed in a light-transmitting display region. In the plurality of first light-emitting devices 22 disposed in the light-transmitting display region 211, connection positions of at least two adjacent first light-emitting devices 22 with the connecting line 24 have a designated distance in the second direction f2.

For example, the connection positions of two adjacent first light-emitting devices 22 and the connecting line 24 are a first connection position K1 and a second connection position K2. A connection position of one light-emitting device adjacent to the two adjacent first light-emitting devices 22 is K3. The first connection position K1 and the second connection position K2 have a designated distance D1 in the second direction f2, and the third connection position K3 and the second connection position K2 also have the designated distance D1 in the second direction f2, wherein the second direction f2 is perpendicular to the first direction f1, and then the routing space of the connecting line 24 connecting the two adjacent first light-emitting devices 22 is a distance D2 between the second connection position K2 and the third connection position K3.

Referring to FIG. 9, FIG. 9 is a schematic diagram of a structure of a first light-emitting device. A distance between connection positions of two adjacent first light-emitting devices 22 and a connecting line 24 in the second direction f2 is zero, such that a routing space of the connecting line 24 connecting the two adjacent first light-emitting devices 22 is a distance D3 between the second connection position K2 and the third connection position K3. Compared with the arrangement of the corresponding connection positions of the light-emitting devices in FIG. 5, D2 is larger than D3, that is, the routing space of the connecting lines 24 between the light-emitting devices 22 according to the embodiments of the present disclosure is relatively large.

In this way, in the case that the acute angle α is provided between the extending direction of at least part of segments of at least one connecting line 24 in the plurality of connecting lines 24 and the first direction f1, the at least part of segments being disposed in the light-transmitting display region 211, the routing space of the connecting lines 24 disposed in the light-transmitting display region 211 is relatively large.

Figure 10:
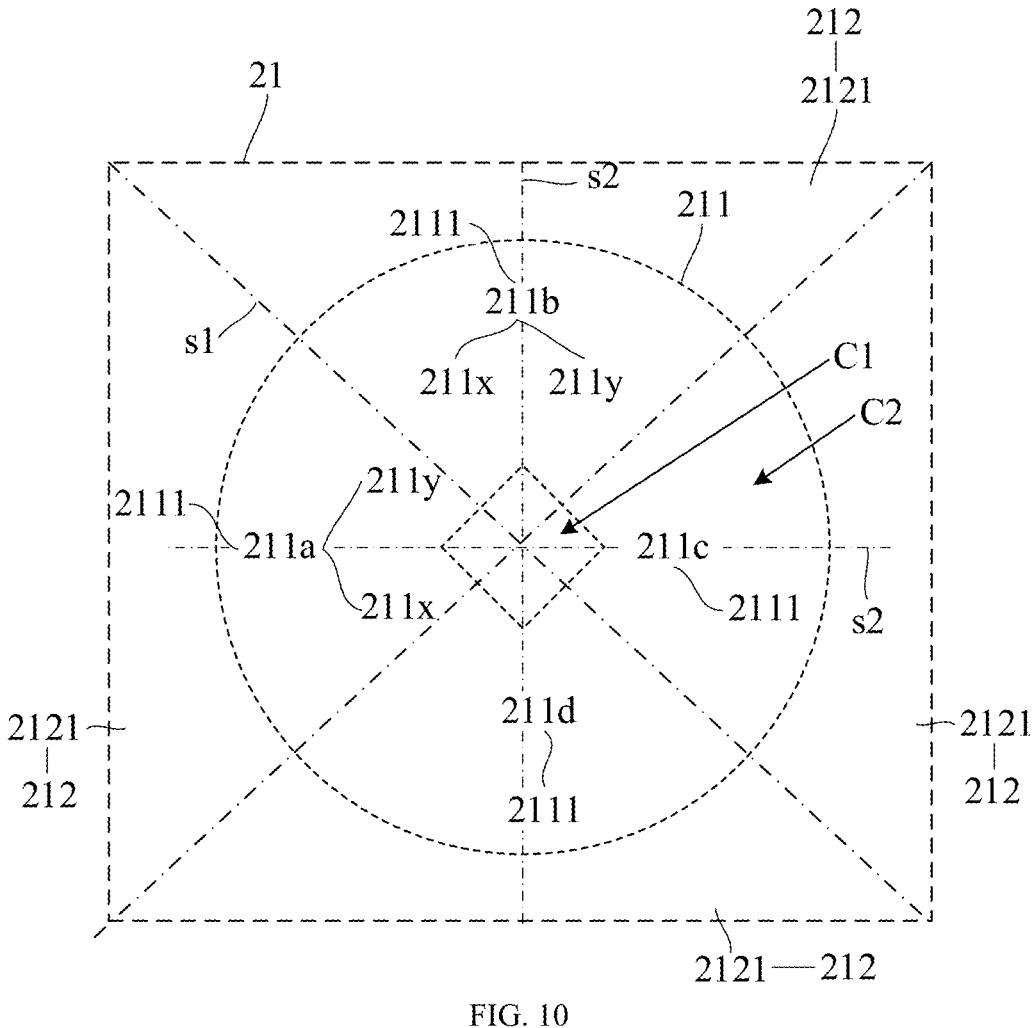
FIG. 10 is a schematic diagram of a partition according to some embodiments of the present disclosure.
Figure 11:
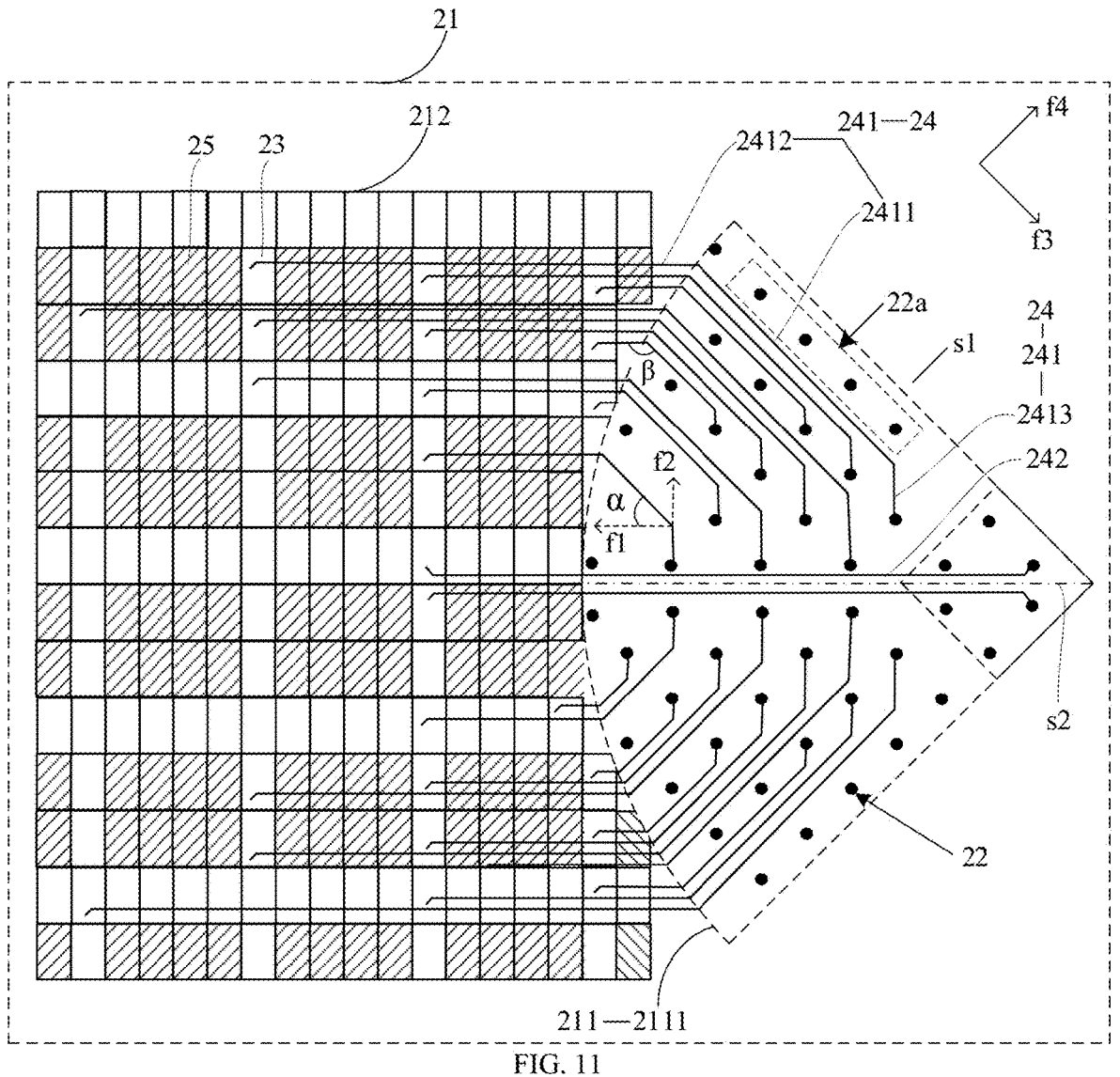
FIG. 11 is a schematic diagram of a structure of another light-transmitting display region according to some embodiments of the present disclosure.

In an optional embodiment, as shown in FIG. 10, FIG. 10 is a schematic diagram of a partition according to some embodiments of the present disclosure. The light-transmitting display region 211 is provided with a plurality of light-transmitting partitions 2111, wherein at least part of the plurality of first light-emitting devices 22 are disposed in the light-transmitting partitions 2111, the light-transmitting partitions 2111 have the same area, and the plurality of light-transmitting partitions 2111 are disposed around the center of the light-transmitting display region 211. At least one connecting line 24 in the light-transmitting partition 2111 that is coupled to the first light-emitting device 22 is extended from the center of the light-transmitting display region 211 to the edge of the light-transmitting display region 211.

In this way, the number of the first light-emitting devices 22 in the plurality of light-transmitting partitions 2111 are substantially the same, such that difference between lengths of the connecting lines 24 corresponding to the first light-emitting devices 22 in the plurality of light-transmitting partitions 2111 is relatively small, and brightness of the first light-emitting devices 22 in the plurality of light-transmitting partitions 2111 of the light-transmitting display region 211 is uniform, thereby improving the display effect of the light-transmitting display region 211.

In some embodiments, the light-transmitting display region 211 is provided with four light-transmitting partitions 2111, and a shape of the light-transmitting partition 2111 is a triangle or fan-shaped. In a case that a shape of the light-transmitting display region 211 is a rectangle, the shape of the light-transmitting partition 2111 is a triangle; in a case that the shape of the light-transmitting display region 211 is a circle, the shape of the light-transmitting partition 2111 is fan-shaped. The plurality of light-transmitting partitions 2111 are disposed around the center of the light-transmitting display region 211, and the center refers to an intersection point of two diagonal lines or the center of the light-transmitting display region 211.

In some embodiments, as shown in FIG. 10, the light-transmitting partition 2111 includes a first sub-partition 211$x$ and a second sub-partition 211$y$ divided by a connection line s2 between the center of the light-transmitting display region 211 and the edge of the light-transmitting display region 211, that is, the first sub-partition 211$x$ is adjacent to the second sub-partition 211$y$.

The connecting lines 24 of the first light-emitting devices 22 that are disposed in the first sub-partition 211$x$ are extended in a different direction from the connecting lines 24 of the first light-emitting devices 22 that are disposed in the second sub-partition 211$y$. For example, the acute angle $\alpha$ is provided between the connecting lines 24 of the first light-emitting devices 22 that are disposed in the first sub-partition 211$x$ and the first direction f1 of the at least one row of first light-emitting devices 22, and the acute angle $\alpha$ is also provided between the connecting lines 24 of the first light-emitting devices 22 that are disposed in the second sub-partition 211$y$ and the first direction f1 of the at least one row of first light-emitting devices 22, such that an angle between the connecting lines 24 of the first light-emitting devices 22 that are disposed in the first sub-partition 211$x$ and the connecting lines 24 of the first light-emitting devices 22 that are disposed in the second sub-partition 211$y$ is 2$\alpha$.

In some embodiments, as shown in FIG. 10, the connection line s2 between the center of the light-transmitting display region 211 and the edge of the light-transmitting display region 211 is a symmetry axis of the light-transmitting partition 2111. In this way, the areas of the first sub-partition 211$x$ and the second sub-partition 211$y$ in the light-transmitting partition 2111 are the same, and the number of the light-emitting devices 22 in the first sub-partition 211$x$ and the second sub-partition 211$y$ are substantially the same, such that the difference between the lengths of the connecting lines 24 corresponding to the light-emitting devices 22 in the first sub-partition 211$x$ and the second sub-partition 211$y$ is relatively small, thereby improving the display effect of the light-transmitting display region 211 by making the brightness of the light-emitting devices 22 in the first sub-partition 211$x$ and the second sub-partition 211$y$ of the light-transmitting display region 211 be uniform.

The symmetry axis is parallel to or perpendicular to the first direction f1. In some embodiments, the light-transmitting display region 211 is provided with a plurality of light-transmitting partitions 2111, wherein a plurality of symmetry axes of the plurality of light-transmitting partitions 2111 are parallel to or perpendicular to each other, in this way, the layout of the traces 24 in the light-transmitting display region 211 is relatively regular.

In some embodiments, as shown in FIG. 7, the light-transmitting partition 2111 includes a parallel connecting region C1 and an oblique connecting region C2 located on one side of the parallel connecting region C1 distal from the center. At least one first light-emitting device 22 disposed in the parallel connecting region C1 is coupled to the second trace 242, and at least one first light-emitting device 22 disposed in the oblique connecting region C2 is coupled to the first trace 241. The first light-emitting device 22 in the plurality of first light-emitting devices 22 that is close to the center of the light-transmitting display region 211 is coupled to the second trace 242.

It is understood that the light-transmitting partition 2111 including the first sub-partition 211$x$ and the second sub-partition 211$y$, and the light-transmitting partition 2111 including the parallel connecting region C1 and the oblique connecting region C2 are two dividing ways of the light-transmitting partition 2111. In some embodiments, these two dividing ways are present in the light-transmitting partition 2111 at the same time. For example, the first sub-partition 211$x$ includes a first parallel connecting region and a first oblique connecting region, and the second sub-partition 211$y$ includes a second parallel connecting region and a second oblique connecting region.

Referring to FIG. 7, the first trace 241 connected with the first light-emitting device 22 disposed in the oblique connecting region C2 is extended from the center of the light-transmitting display region 211 to the edge of the light-transmitting display region 211. In this way, a partial region where no oblique connecting line is arranged is present near the symmetry axis in the light-transmitting partition 2111, for example, the region E1 in FIG. 7. In some embodiments, the region E1 is configured to arrange the second trace 242, wherein the second trace 242 is connected with the first light-emitting device 22 disposed in the parallel connecting region C1. In this way, the routing space in the light-transmitting display region 211 is reasonably utilized, and more connecting lines 24 are arranged under the same light-transmitting display region 211 compared with a single-direction routing.

Figure 12:
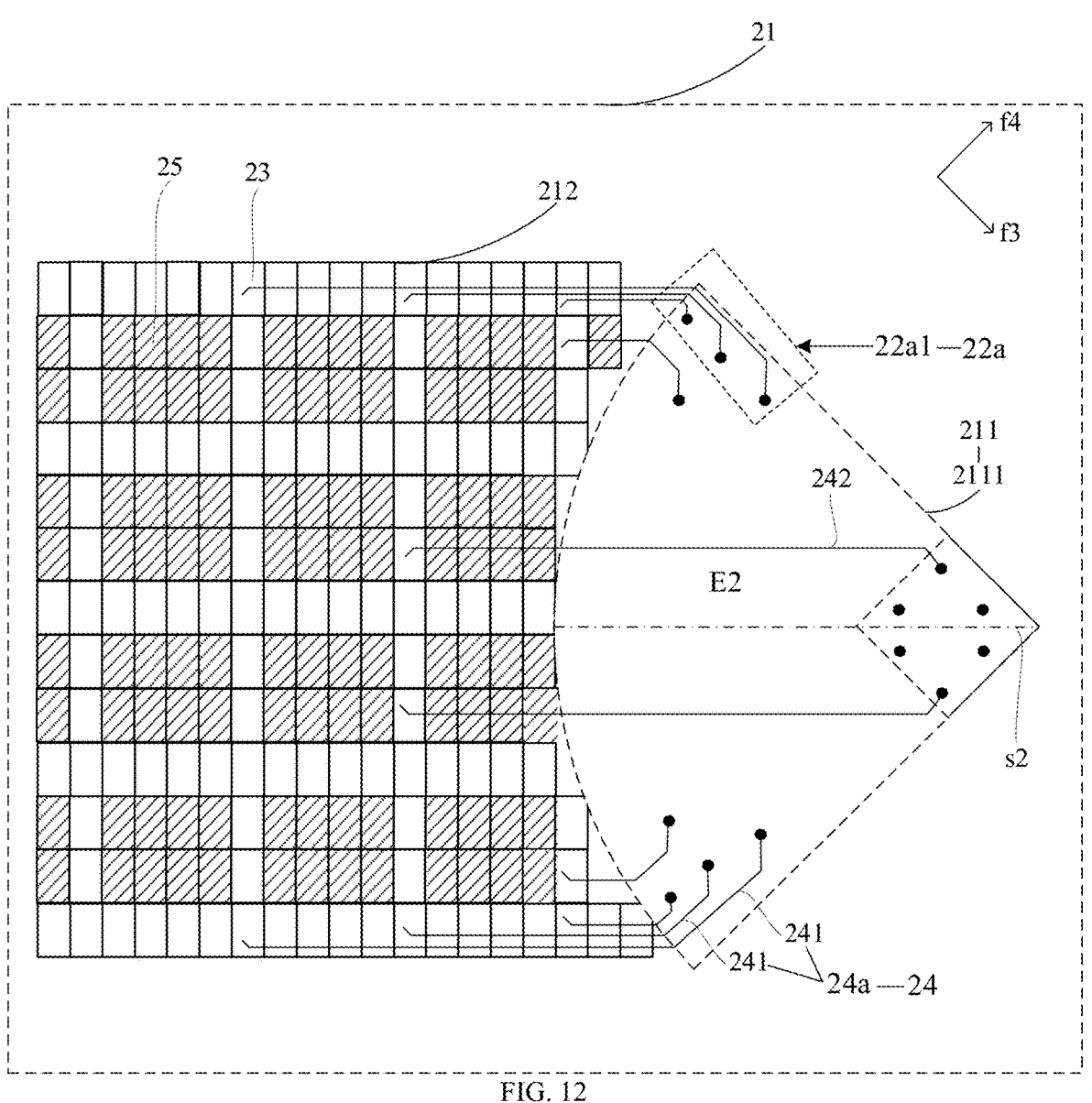
FIG. 12 is a schematic diagram of a structure of still another light-transmitting display region according to some embodiments of the present disclosure.
Figure 13:
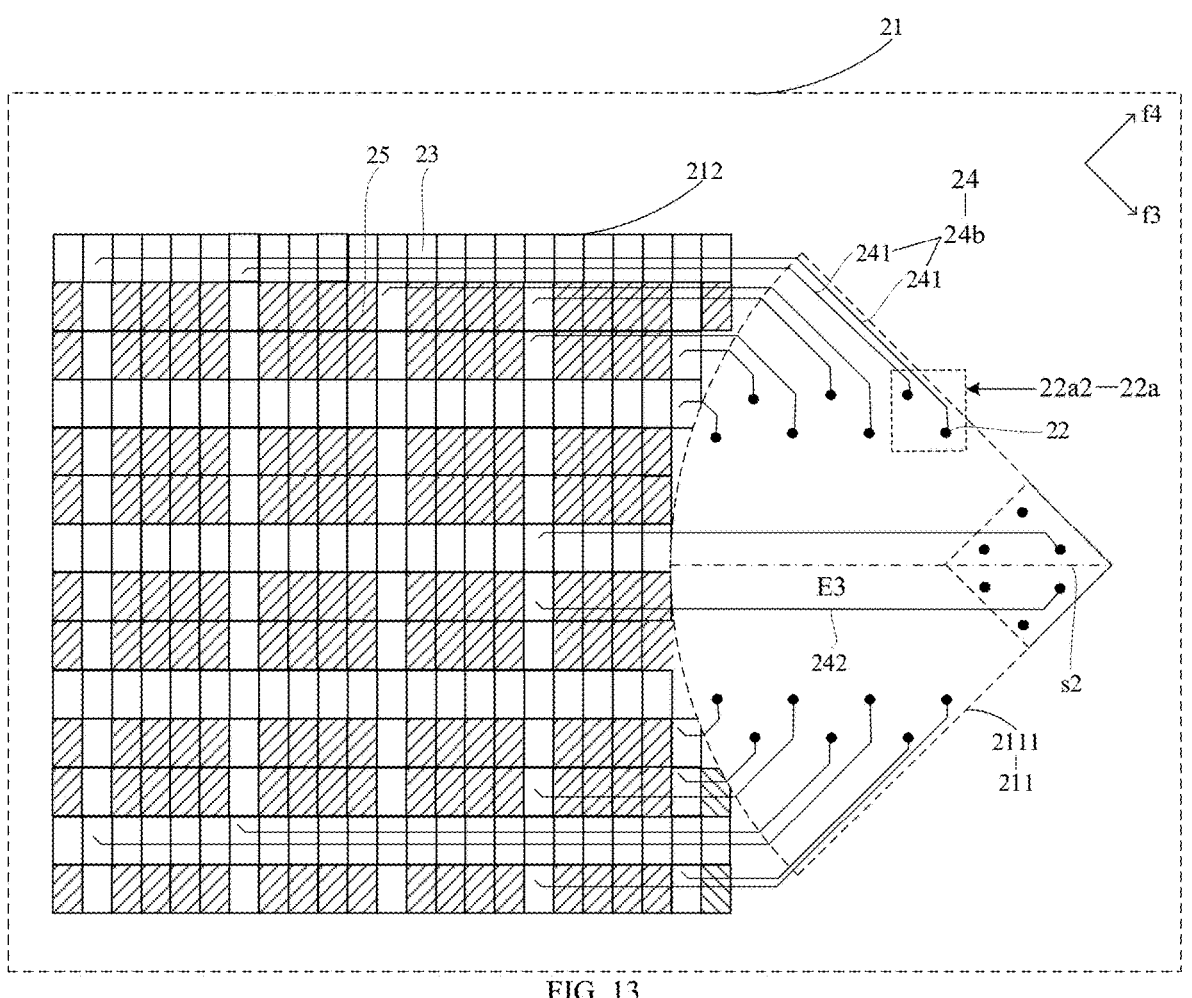
FIG. 13 is a schematic diagram of a structure of yet still another light-transmitting display region according to some embodiments of the present disclosure.
Figure 14:
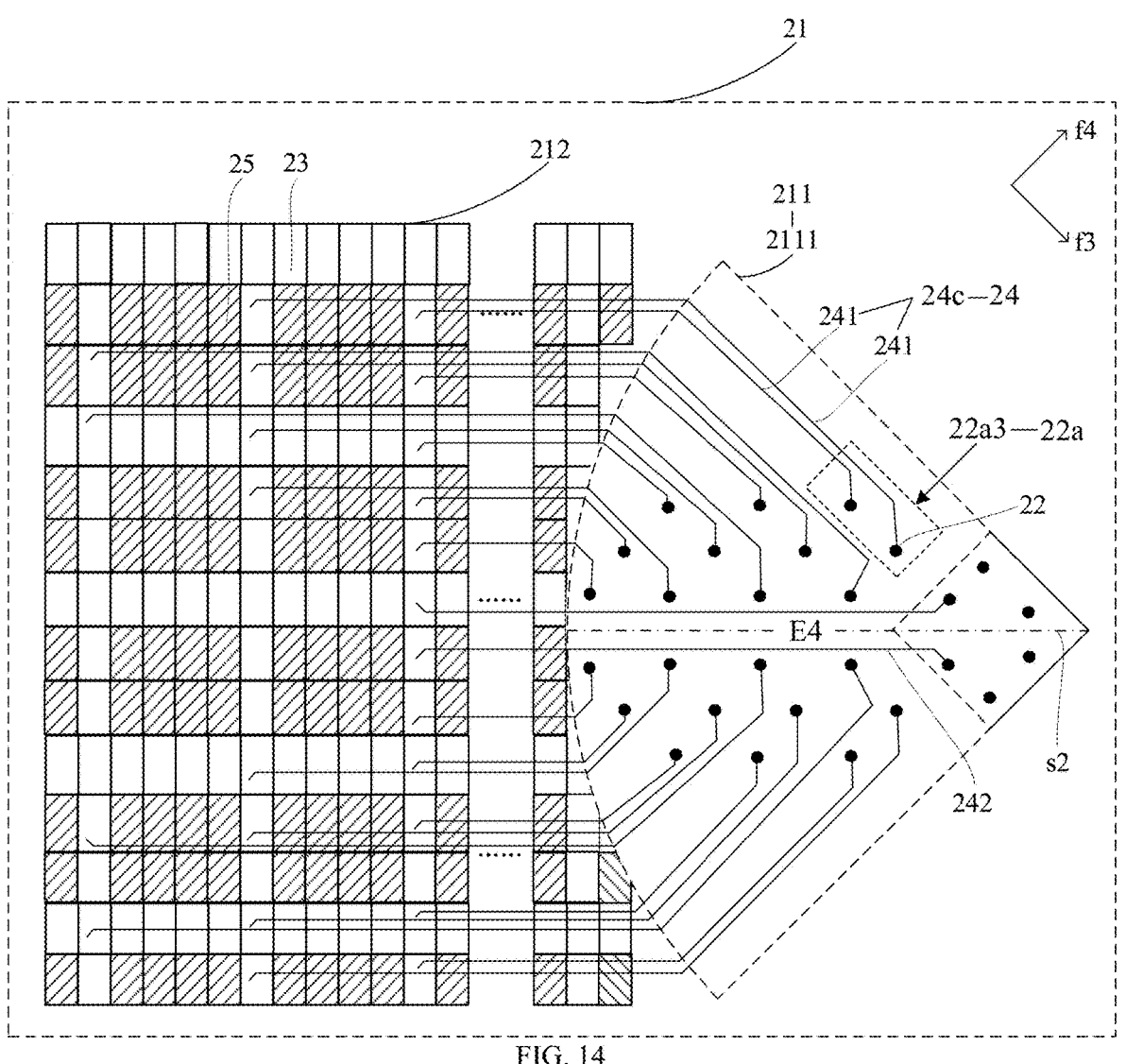
FIG. 14 is a schematic diagram of a structure of yet still another light-transmitting display region according to some embodiments of the present disclosure.

In some embodiments, referring to FIG. 11, FIG. 12, FIG. 13, and FIG. 14, FIG. 11 is a schematic diagram of a structure of another display panel according to some embodiments of the present disclosure, and FIG. 12, FIG. 13, and FIG. 14 are schematic diagrams of structures of other three light-transmitting display regions according to some embodiments of the present disclosure. It should be noted that, in FIG. 12, FIG. 13, and FIG. 14, for convenience of indicating the position of the first light-emitting device connected by the connecting line in each structural layer, the connecting lines in different layers are shown in three schematic diagrams. In some embodiments, the plurality of first light-emitting devices 22 include a plurality of groups of first light-emitting devices 22$a$, wherein each group of first light-emitting devices 22$a$ in the plurality of groups of first light-emitting devices 22$a$ are extended along a third direction f3, and the plurality of groups of first light-emitting devices 22$a$ are arranged along a fourth direction f4. The first direction f1, the second direction f2, the third direction f3, and the fourth direction f4 do not coincide.

One group of first light-emitting devices 22$a$ in the plurality of groups of first light-emitting devices 22$a$ include at least two light-emitting units arranged along the third direction f3, the light-emitting unit includes at least one first light-emitting device 22, and the at least two light-emitting units are coupled to the connecting lines 24 disposed at different layers.

It should be noted that at least two light-emitting units including a first light-emitting unit 22a1, a second light-emitting unit 22a2, and a third light-emitting unit 22a3 is taken as an example in the embodiments of the present disclosure, and the at least two light-emitting units may be further provided with other light-emitting units, which is not limited in the embodiments of the present disclosure. The plurality of first traces 241 connected with the first light-emitting unit 22a1, the second light-emitting unit 22a2 and the third light-emitting unit 22a3 are a first connecting line group 24a, a second connecting line group 24b and a third connecting line group 24c, respectively. The first connecting line group 24a, the second connecting line group 24b and the third connecting line group 24c are disposed in different layers on the substrate.

The first connecting line group 24a, the second connecting line group 24b and the third connecting line group 24c are arranged based on a sequence of the first light-emitting unit 22a1, the second light-emitting unit 22a2 and the third light-emitting unit 22a3. The connecting lines in the first connecting line group 24a, the second connecting line group 24b and the third connecting line group 24c are the first connecting lines 241. In this way, the routing space of the connecting lines 24 is increased, such that the connecting lines 24 disposed in different layers have respective routing spaces, and more connecting lines 24 are arranged in a limited space compared with a single-layer routing.

As shown in FIG. 12, in a one-layer routing space where the first connecting line group 24a is arranged, a partial region E2 where the first connecting line group 24a is not arranged is present near a symmetry axis s2 in the light-transmitting partition 2111, wherein the partial region E2 is configured to arrange the second trace 242 in the light-transmitting partition 2111. Similarly, as shown in FIG. 13, in a one-layer routing space where the second connecting line group 24b is arranged, a partial region E3 where the second connecting line group 24b is not arranged is present near the symmetry axis s2 in the light-transmitting partition 2111, wherein the partial region E3 is configured to arrange the second trace 242 in the light-transmitting partition 2111. As shown in FIG. 14, in a one-layer routing space where the third connecting line group 24c is arranged, a partial region E4 where the third connecting line group 24c is not arranged is present near the symmetry axis s2 in the light-transmitting partition 2111, wherein the partial region E4 is configured to arrange the second trace 242 in the light-transmitting partition 2111.

Areas of the partial regions described above satisfy a relationship of E2>E3>E4. In this way, more second traces 242 are arranged in the partial region E2.

In an optional embodiment, as shown in FIG. 7 and FIG. 8, the first light-emitting devices 22 shown in FIG. 8 are eight first light-emitting devices 22 in the plurality of first light-emitting devices 22 in the display panel shown in FIG. 7. The shape of the light-transmitting display region 211 is a circle, the shape of the first light-emitting device 22 is a rectangle, or the shape of a pixel unit where the first light-emitting device 22 is disposed is a rectangle, wherein an aspect ratio of the rectangle is 2:1, and a long side of the rectangle is perpendicular to the first direction f1. It should be noted that the shape of the first light-emitting device 22 is at least one of a hexagon, a trapezoid, an ellipse, and a circle in some embodiments of the present disclosure. For example, the shape of the pixel unit where one first light-emitting device 22 is disposed is a rectangle, the rectangle in FIG. 13 indicates the shape of the pixel unit where the first light-emitting device 22 is disposed, and also indicates the shape of the anode of the first light-emitting device 22. A black dot is configured to indicate a connection position of the first light-emitting device 22 and the connecting line 24; for convenience of indicating the arrangement of the first light-emitting device 22 and the connecting line 24, the first light-emitting device 22 is indicated by the connection position (i.e., the black dot) of the first light-emitting device 22 and the connecting line 24 in at least part of accompanying drawings. The connection positions of the adjacent two first light-emitting devices 22 and the connecting line 24 have a designated distance X in the second direction f2, the distance of the connection positions of the adjacent two first light-emitting devices 22 and the connecting line 24 in the first direction f1 is Y, and the distance of a connection line between the connection positions of the adjacent two first light-emitting devices 22 and the connecting line 24 is Z, wherein Z is equal to the square root of a sum of X plus Y. In this way, the routing space of the connecting lines 24 coupled to the first light-emitting devices 22 disposed in the oblique connecting region C2 is Z. The routing space of the connecting line 24 is relatively large compared with the routing space being X or Y in the related art, and a plurality of connecting lines 24 coupled to the first light-emitting devices 22 in the light-transmitting display region 211 are located at different layers, which further increases the routing space of the connecting line 24.

Since the number of the connecting lines 24 is limited by the routing space in the light-transmitting display region 211, the number of the light-emitting devices 22 corresponding to the connecting lines 24 is limited, and the area of the light-transmitting display region 211 is further limited (in a case that an arrangement density of the light-emitting devices 22 is not changed, the more the number of the light-emitting devices 22 is, the larger the area of the light-transmitting display region 211 is). Therefore, the layered arrangement of the connecting lines 24 and the routing of the connecting lines 24 extending along a plurality of directions make the light-transmitting display region 211 have more routing space, and the larger number of connecting lines 24 are arranged, such that the larger number of the plurality of first light-emitting devices 22 are arranged, and the area of the light-transmitting display region 211 is increased.

In some embodiments, under a 458 ppi pixel space (the size of the light-emitting device is 27.675 μm×55.35 μm), in a case that the first light-emitting devices 22 in the light-transmitting display region 211 are coupled to the first pixel drive circuits 23 disposed at two sides of the light-transmitting display region 211 only by adopting the connecting lines 24 parallel to the first direction f1, 42 columns of the first light-emitting devices 22 are disposed in the first direction f1, and a diameter of the light-transmitting display region 211 corresponding thereto is 2.325 mm. In a case that the connecting line 24 corresponding to the light-emitting device 22 in the light-transmitting display region 211 includes the first trace 241 in the oblique connecting region C2 and the second trace 242 in the parallel connecting region C1, 48 rows of the first light-emitting devices 22 are disposed along the first direction f1, and the diameter of the light-transmitting display region 211 corresponding thereto is 3.757 mm. The area of the light-transmitting display region in the embodiments of the present disclosure is increased by 61.5% compared with the area of the light-transmitting display region in the routing manner where only the connecting lines 24 parallel to the first direction f1 are adopted.

Figure 15:
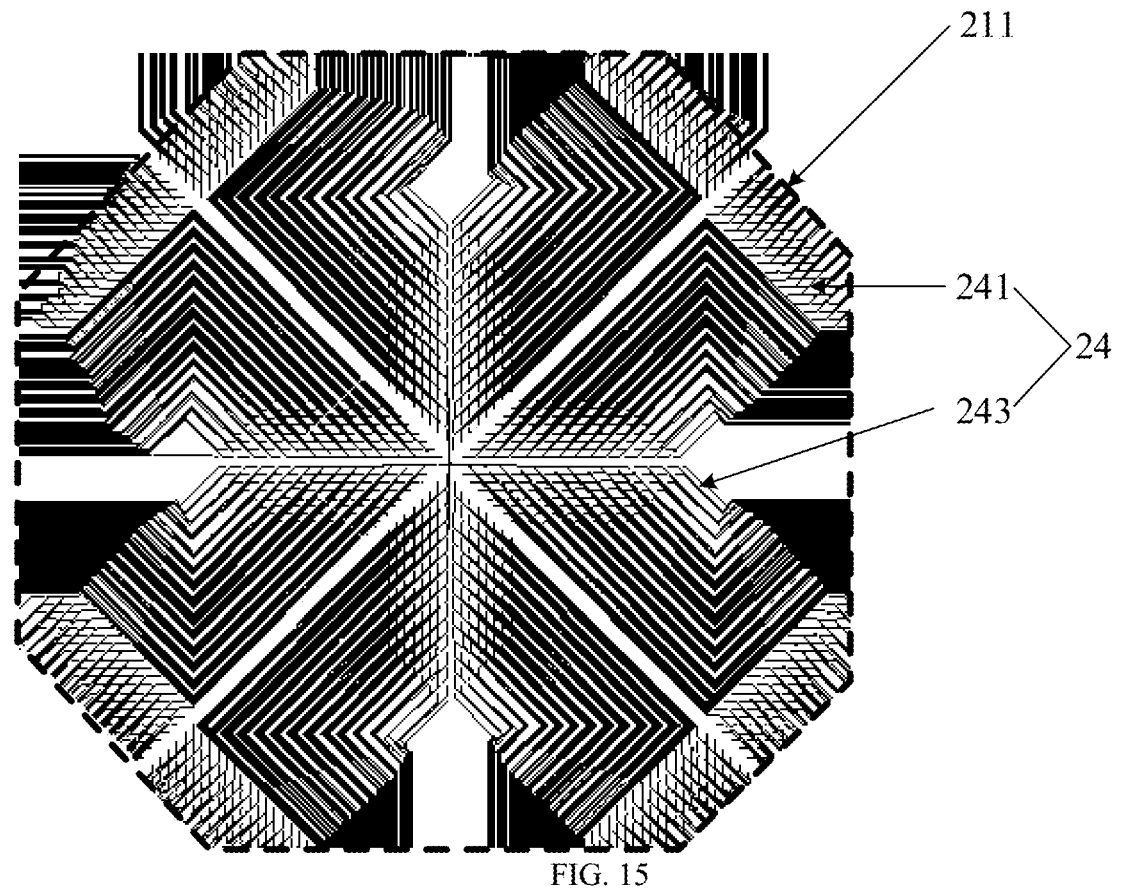
FIG. 15 is a schematic diagram of routing of another light-transmitting display region according to some embodiments of the present disclosure.
Figure 16:
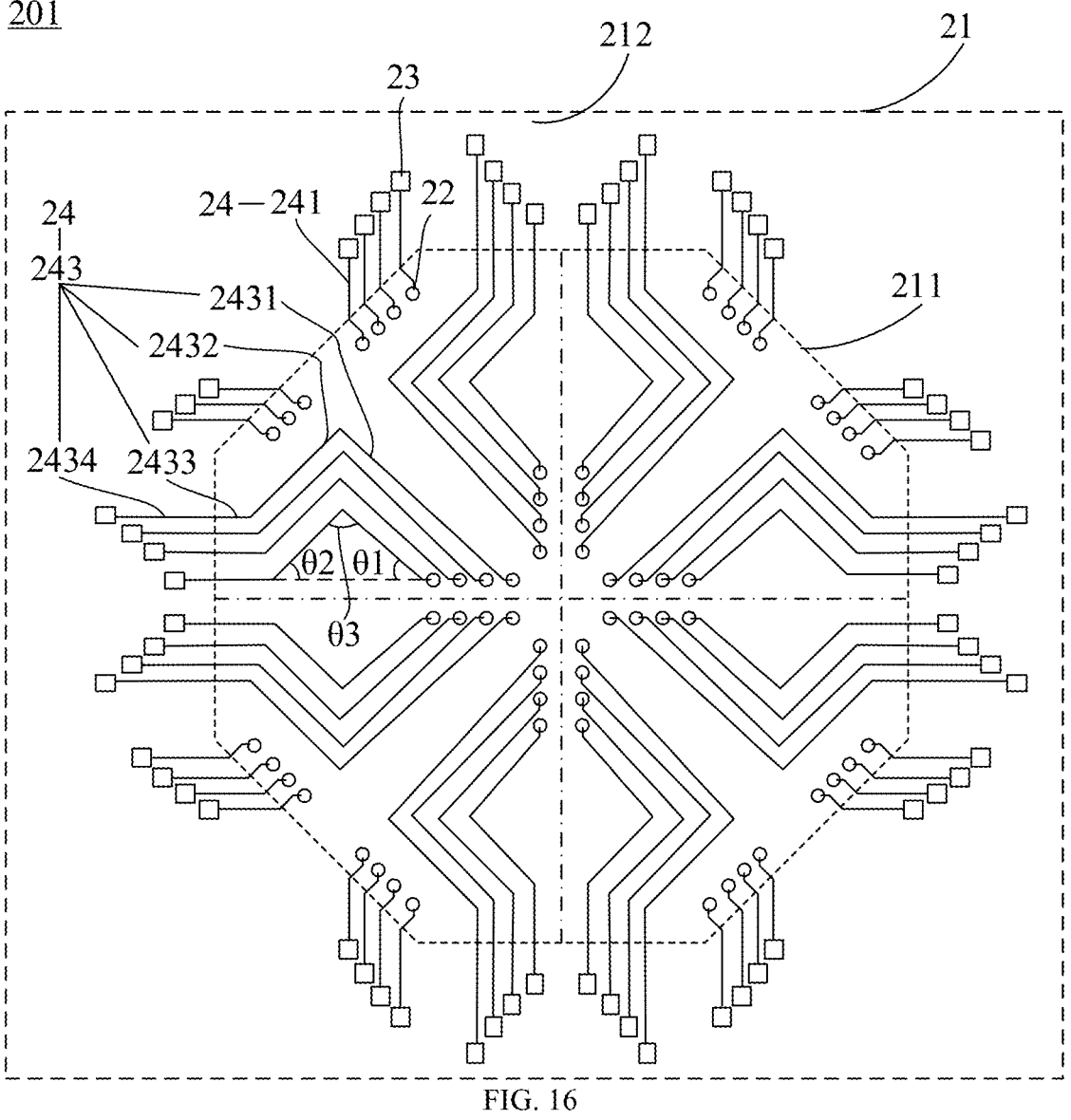
FIG. 16 is a schematic diagram of a connection structure of the light-transmitting display region shown in FIG. 15.

In some embodiments, as shown in FIG. 15 and FIG. 16, FIG. 15 is a schematic diagram of routing of another light-transmitting display region according to some embodiments of the present disclosure, and FIG. 16 is a schematic diagram of a connection structure of the light-transmitting display region shown in FIG. 15. The shape of the light-transmitting display region 211 is an octagon. The at least one connecting line 24 further includes a third trace 243, wherein the third trace 243 includes a fourth segment 2431, a fifth segment 2432 and a sixth segment 3433 disposed in the light-transmitting display region 211, and a seventh segment 2434 disposed in the conventional display region 212. The fourth segment 2431, the fifth segment 2432, the sixth segment 2433, and the seventh segment 2434 are sequentially connected. The fourth segment 2431 is coupled to the first light-emitting device 22, and the seventh segment 2434 is coupled to the first pixel drive circuit 23. An angle θ1 between the fourth segment 2431 and the first direction f1 is greater than 0 degree and less than 90 degrees, and an angle θ2 between the fifth segment 2432 and the first direction f1 is greater than 0 degree and less than 90 degrees. Therefore, the connecting lines 24 in the light-transmitting display region 211 have more routing manners, and the flexibility of routing of the connecting lines 24 in the light-transmitting display region 211 is improved.

In some embodiments, an angle θ3 between the fourth segment 2431 and the fifth segment 2432 is greater than 45 degrees and less than 135 degrees. For example, the angle θ3 between the fourth segment 2431 and the fifth segment 2432 is 90 degrees. In this way, the routing of the third trace 243 in the light-transmitting display region 211 is relatively regular.

Figure 17:
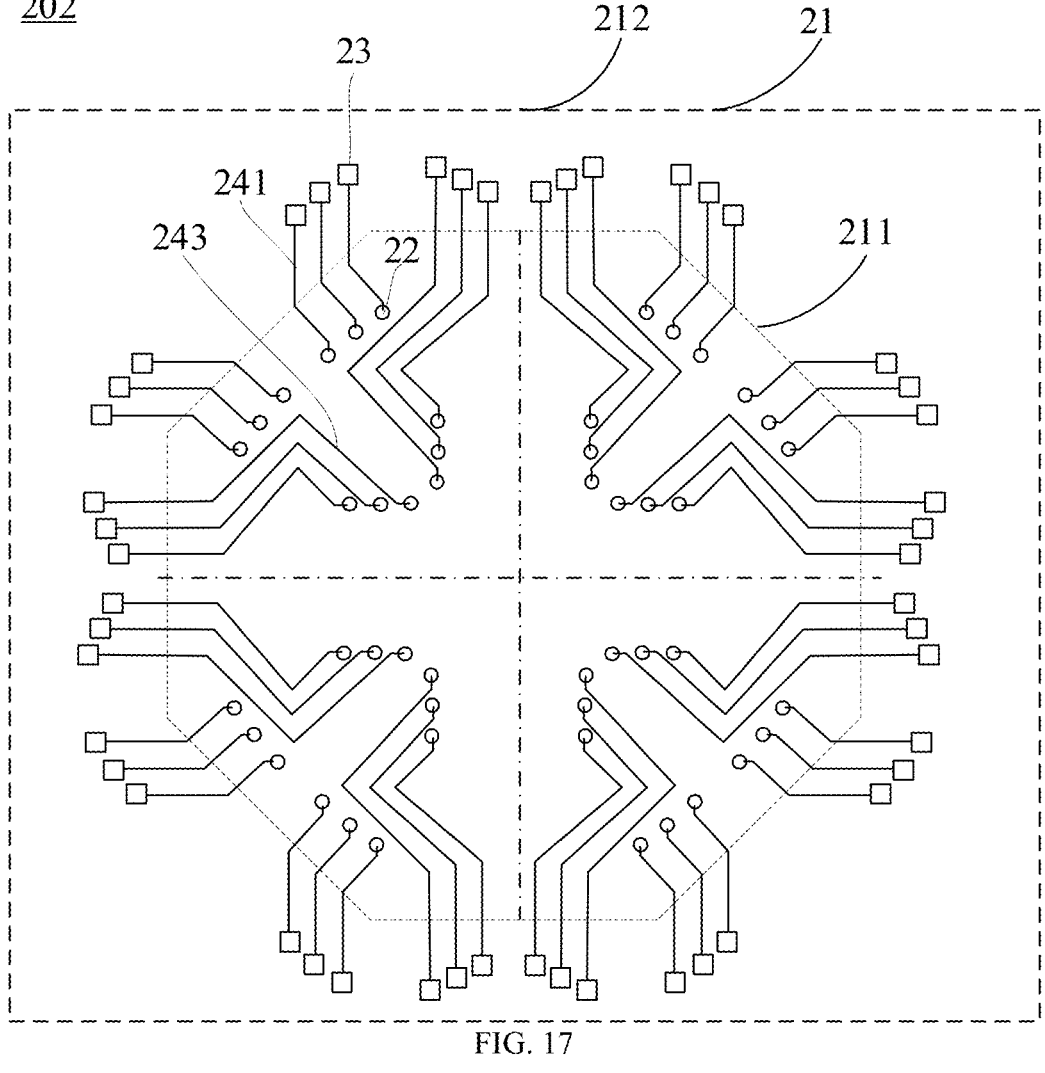
FIG. 17 is a schematic diagram of a connection line of another light-transmitting display region according to some embodiments of the present disclosure.
Figure 18:
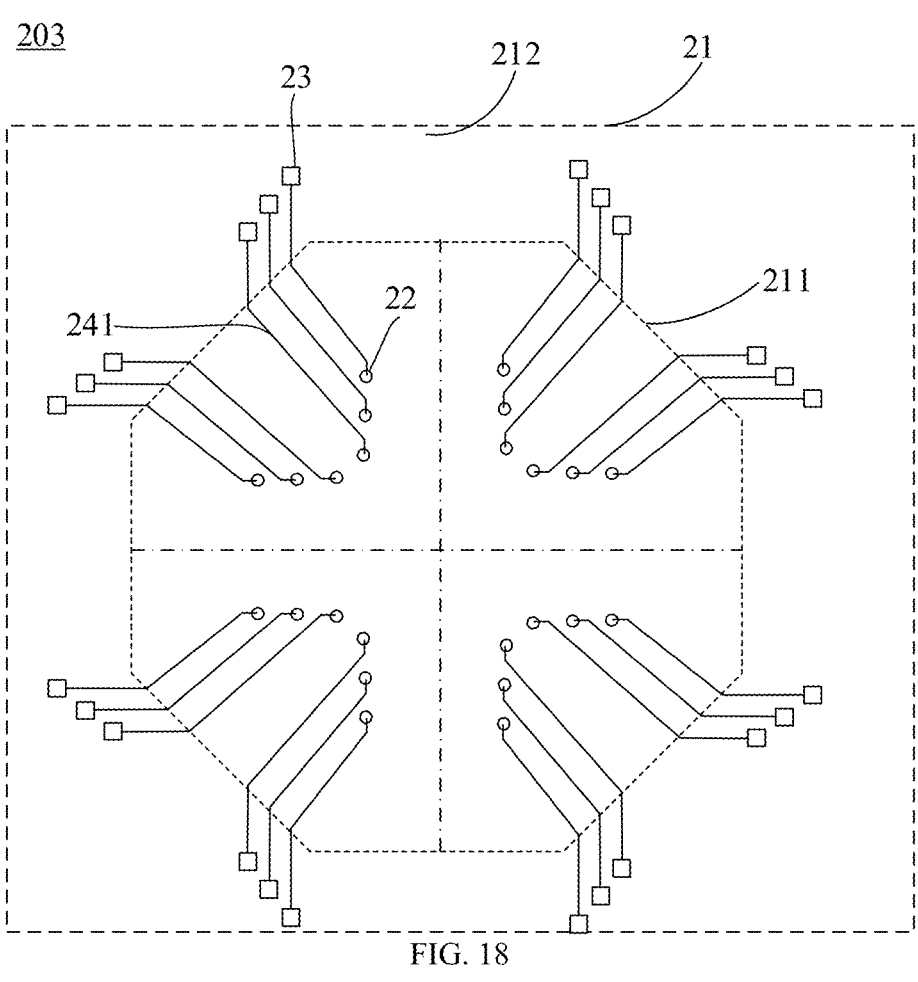
FIG. 18 is a schematic diagram of a connection line of still another light-transmitting display region according to some embodiments of the present disclosure.

Referring to FIG. 16, FIG. 17, and FIG. 18, FIG. 17 is a schematic diagram of a connection line of another light-transmitting display region according to some embodiments of the present disclosure, and FIG. 18 is a schematic diagram of a connection line of still another light-transmitting display region according to some embodiments of the present disclosure. Only the connection of the connecting lines 24 in a partial region in the light-transmitting display region 211 is shown in FIG. 16, FIG. 17, and FIG. 18, thereby clearly showing the connection of the plurality of first light-emitting devices 22, and the connection of the other regions is the same as the shown connection.

Referring to FIG. 16, FIG. 17, and FIG. 18, the first light-emitting devices 22 connected with the connecting lines 24 of different layers are shown in three diagrams. A plurality of first light-emitting devices 22 coupled to a plurality of connecting lines 24 disposed in a first structural layer 201 are shown in FIG. 16. A plurality of first light-emitting devices 22 coupled to a plurality of connecting lines 24 disposed in a second structural layer 202 are shown in FIG. 17. A plurality of first light-emitting devices 22 coupled to a plurality of connecting lines 24 disposed in a third structural layer 203 are shown in FIG. 18. The plurality of connecting lines 24 disposed in the first structural layer 201 include the first trace 241 and the third trace 243. The plurality of connecting lines 24 disposed in the second structural layer 202 include the first trace 241 and the third trace 243. The first light-emitting device 22 coupled to the first trace 241 in the second structural layer 202 is disposed on one side of the first light-emitting device 22 coupled to the first trace 241 in the first structural layer 201, wherein the side is close to the center of the light-transmitting display region 211. The first light-emitting device 22 coupled to the third trace 243 in the second structural layer 202 is disposed at one side of the first light-emitting device 22 coupled to the third trace 243 in the first structural layer 201, wherein the side is distal from the center of the light-transmitting display region 211.

The plurality of connecting lines 24 disposed in the third structural layer 203 include the first trace 241. The first light-emitting device 22 coupled to the first trace 241 in the third structural layer 203 is disposed at one side of the first light-emitting device 22 coupled to the third trace 243 in the second structural layer 202, wherein the side is distal from the center of the light-transmitting display region 211. And the first light-emitting device 22 coupled to the first trace 241 in the third structural layer 203 is also disposed at one side of the first light-emitting device 22 coupled to the first trace 241 in the second structural layer 202, wherein the side is close to the center of the light-transmitting display region 211.

In this way, the same structural layer of the display panel 20 includes a plurality of traces, such that the flexibility of the arrangement of the connecting lines 24 coupled to the first light-emitting devices in the light-transmitting display region 211 is improved.

Figure 19:
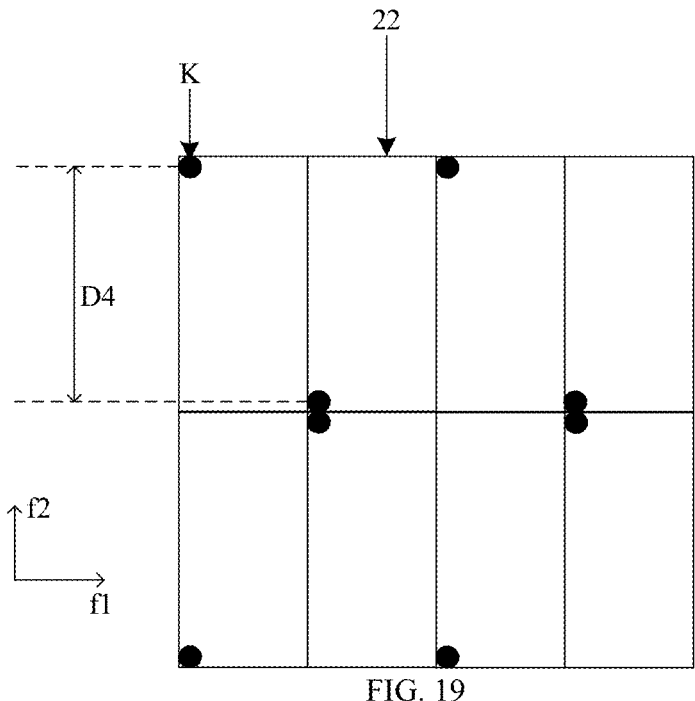
FIG. 19 is a schematic diagram of a structure of a first light-emitting device in another display panel according to some embodiments of the present disclosure.
Figure 20:
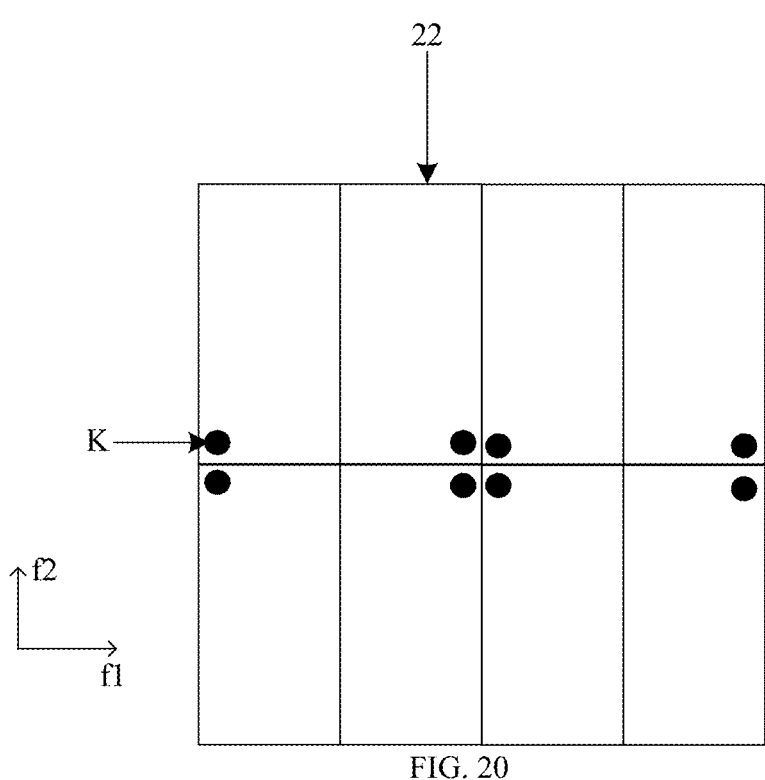
FIG. 20 is a schematic diagram of a structure of a first light-emitting device in still another display panel according to some embodiments of the present disclosure.

In an optional embodiment, referring to FIG. 19 and FIG. 20, FIG. 19 and FIG. 20 are schematic diagrams of structures of first light-emitting devices in another two display panels according to some embodiments of the present disclosure. As shown in FIG. 19, in the plurality of first light-emitting devices 22 disposed in a row in the light-transmitting display region, the connection positions K of at least two adjacent first light-emitting devices 22 and the connecting lines have a distance D4 in the second direction f2, wherein the second direction f2 is perpendicular to the first direction f1, and the connection positions K are all disposed at the corner of the first light-emitting devices 22.

As shown in FIG. 20, FIG. 20 shows another arrangement of the connection positions K of the first light-emitting devices 22 and the connecting lines 24, and the connection positions K are all disposed at corners of the first light-emitting devices 22. In this way, the distance of the connection line between adjacent two first light-emitting devices 22 is relatively large, such that the routing space of the connecting lines between two adjacent first light-emitting devices 22 is relatively large. It should be noted that the connection position K of the first light-emitting device 22 and the connecting line 24 in the embodiments of the present disclosure is not limited to the arrangement of the connection position K shown in FIG. 8, FIG. 19, and FIG. 20. The connection position K may be arranged in other manners, which is not limited in the embodiments of the present disclosure.

In some embodiments, as shown in FIG. 10, the conventional display region 212 is provided with a plurality of conventional sub-partitions 2121, wherein the plurality of conventional sub-partitions 2121 are distributed around the light-transmitting display region 211 and one-to-one corresponding to the plurality of light-transmitting partitions 2111, and the conventional sub-partition 2121 is adjacent to the corresponding light-transmitting partition 2111.

At least part of an edge of the light-transmitting partition 2111 coincide with at least part of an edge of the corresponding conventional sub-partition 2121, such that the length of the connecting lines corresponding to the first light-emitting devices in the plurality of light-transmitting partitions 2111 is relatively short.

In some embodiments, as shown in FIG. 4, the arrangement density of the plurality of second light-emitting devices 26 disposed in the conventional display region 212 is the same as the arrangement density of the plurality of first light-emitting devices 22 disposed in the light-transmitting display region 211. The same arrangement density refers to the number of second light-emitting devices 26 arranged in a unit area of the conventional display region 212 being the same as the number of first light-emitting devices 22 arranged in a unit area of the light-transmitting display region 211.

In this way, the pixel densities or image resolutions of the conventional display region 212 and the light-transmitting display region 211 are the same. The display effects of the conventional display region 212 and the light-transmitting display region 211 are close.

Pixel per inch (PPI) is also referred to as pixel density unit, which indicates the number of pixels per inch in the display region. Therefore, the higher the value of PPI is, the more detailed the displayed picture is.

Image resolution refers to amount of information stored in an image. Image resolution is measured by pixel per inch (PPI). The higher the resolution of the image is, the more pixels the image contains, and the sharper the image is.

Figure 21:
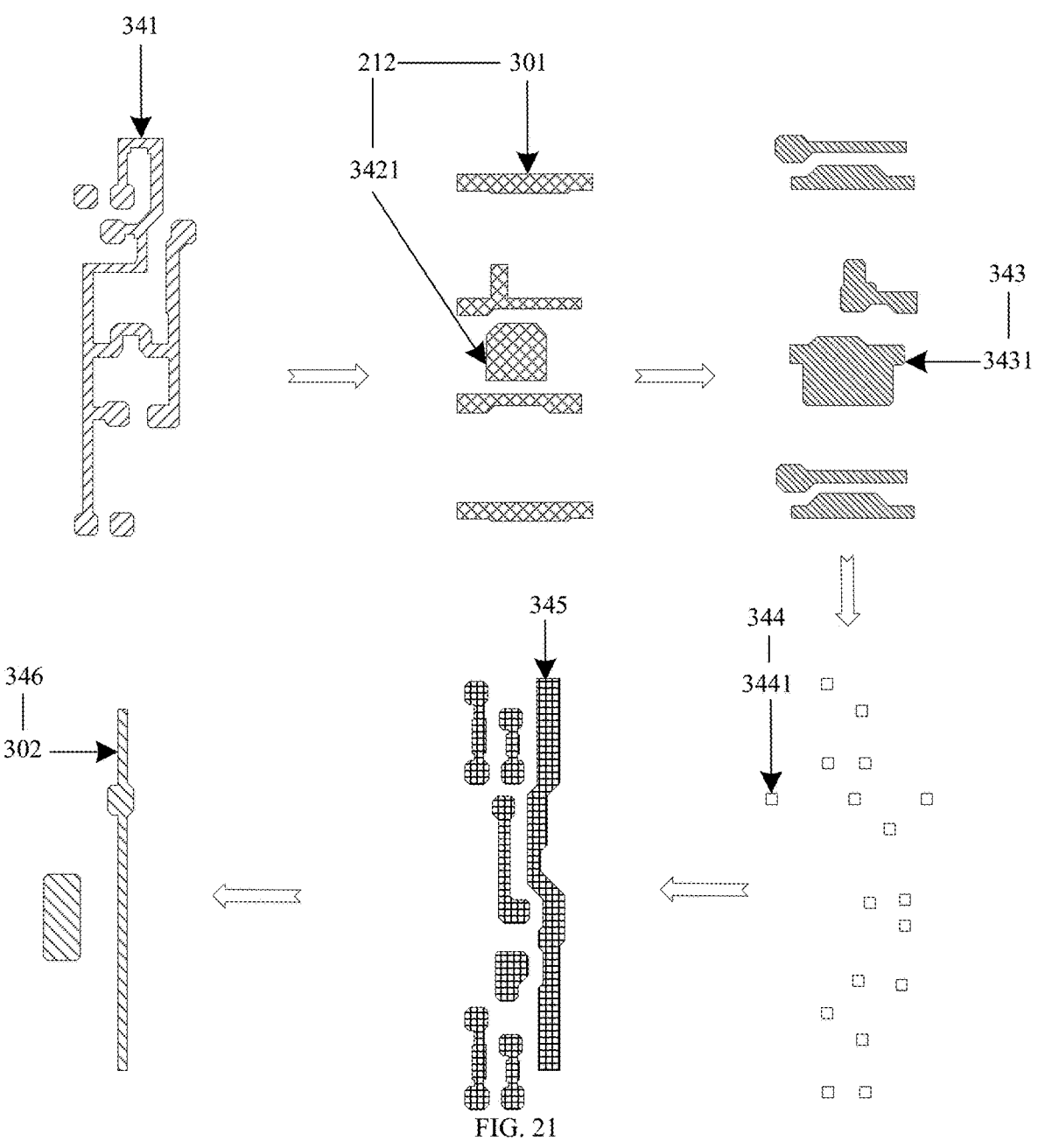
FIG. 21 is a schematic diagram of a structure of film layers of a first pixel drive circuit or a second pixel drive circuit according to some embodiments of the present disclosure.
Figure 22:
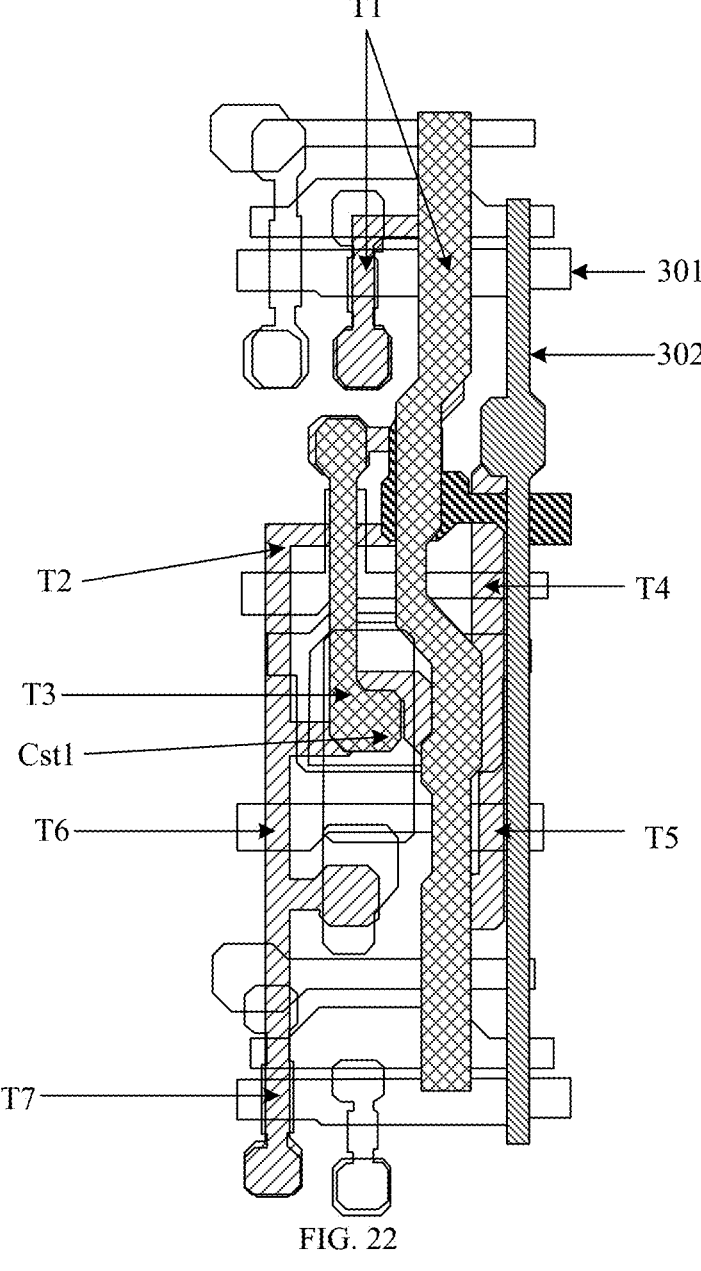
FIG. 22 is a schematic diagram of a structure of a first pixel drive circuit or a second pixel drive circuit according to some embodiments of the present disclosure.
Figure 23:
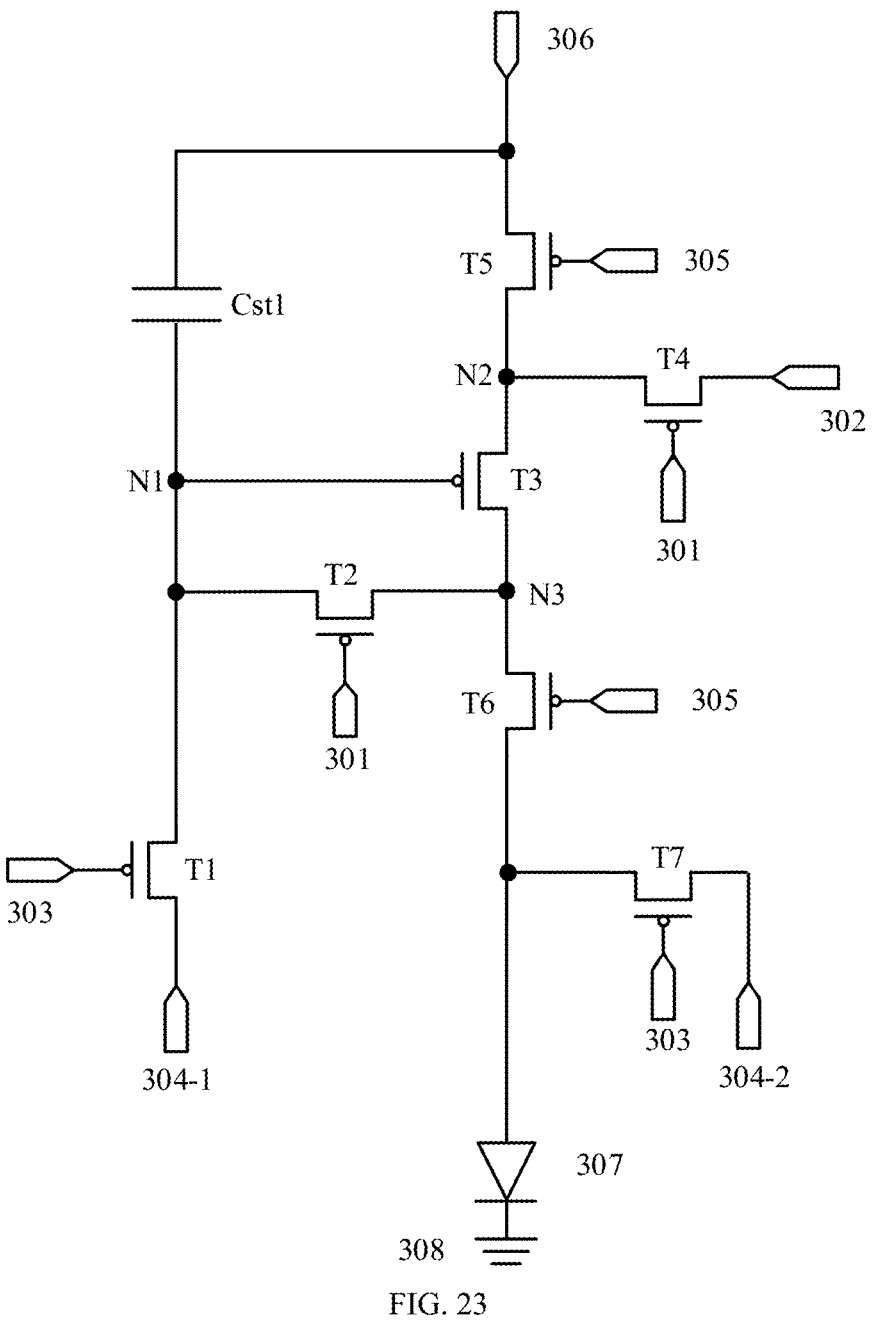
FIG. 23 is a circuit schematic diagram of a first pixel drive circuit or a second pixel drive circuit according to some embodiments of the present disclosure.

Referring to FIG. 21, FIG. 22, and FIG. 23, in an exemplary implementation, as shown in FIG. 21, FIG. 21 is a schematic diagram of a structure of film layers of a first pixel drive circuit or a second pixel drive circuit according to some embodiments of the present disclosure. The second pixel drive circuit includes an active layer pattern 341, a first conductive pattern 342, a second conductive pattern 343, a dielectric layer 344, a third conductive pattern 345, and a fourth conductive pattern 346. The first conductive pattern 342 includes a first plate 3421, a gate line 301, and a gate of a capacitor structure. The second conductive pattern 343 includes a second plate 3431 of the capacitor structure. The dielectric layer 344 is provided with a via hole 3441 thereon. The third conductive pattern 345 includes a power line, a source, and a drain. The fourth conductive pattern 346 includes a data signal line 302. The first pixel drive circuit and the second pixel drive circuit have the same structure in some embodiments of the present disclosure.

In an optional implementation, as shown in FIG. 22, FIG. 22 is a schematic diagram of a structure of a first pixel drive circuit or a second pixel drive circuit according to some embodiments of the present disclosure. The second pixel drive circuit includes a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a capacitor structure Cst1.

In some embodiments, the first thin-film transistor T1 is a first initial thin-film transistor, the second thin-film transistor T2 is a compensation thin-film transistor, the third thin-film transistor T3 is a driving thin-film transistor, the fourth thin-film transistor T4 is a data writing transistor, the fifth thin-film transistor T5 is an operation control thin-film transistor, the sixth thin-film transistor T6 is an emission control thin-film transistor, and the seventh thin-film transistor T7 is a second initial thin-film transistor. In some embodiments, T1 to T7 include a low temperature polysilicon (LTPS) thin-film transistor and/or an oxide thin-film transistor (O-TFT). T1 to T7 may also be other types of thin-film transistors, which are not limited in the embodiments of the present disclosure.

As shown in FIG. 23, FIG. 23 is a circuit schematic diagram of a first pixel drive circuit or a second pixel drive circuit according to some embodiments of the present disclosure. A gate of the third thin-film transistor T3 is connected with a first node N1, a source of the third thin-film transistor T3 is connected with a second node N2, and a drain of the third thin-film transistor T3 is connected with a third node N3.

A gate of the fourth thin-film transistor T4 is connected with the gate line (Gate) 301, a source of the fourth thin-film transistor T4 is connected with the data signal line (Data) 302, and a drain of the fourth thin-film transistor T4 is connected with the second node N2.

A gate of the second thin-film transistor T2 is connected with the gate line 301, a source of the second thin-film transistor T2 is connected with the third node N3, and a drain of the second thin-film transistor T2 is connected with the first node N1.

A gate of the first thin-film transistor T1 is connected with a reset signal line (Reset) 303, a drain of the first thin-film transistor T1 is connected with a first reference signal line (Vinit) 304-1, and a source of the first thin-film transistor T1 is connected with the first node N1.

A gate of the fifth thin-film transistor T5 and a gate of the sixth thin-film transistor T6 are connected with a light emission signal line (EM) 305, a source of the fifth thin-film transistor T5 is connected with a constant-voltage high potential (VDD) 306, a drain of the fifth thin-film transistor T5 is connected with the second node N2, a source of the sixth thin-film transistor T6 is connected with the third node N3, a drain of the sixth thin-film transistor T6 is connected with an anode of a light-emitting device (OLED) 307, and a cathode of the light-emitting device 307 is connected with a low potential (VSS) 308.

A gate of the seventh thin-film transistor T7 is connected with the gate line 301, a drain of the seventh thin-film transistor T7 is connected with a second reference signal line 304-2, and a source of the seventh thin-film transistor T7 is connected with the anode electrode of the light-emitting device 307.

One terminal of the capacitor Cst1 is connected with the first node N1, and the other terminal of the capacitor Cst1 is connected with the constant-voltage high potential 306.

In some embodiments, the voltage values of the first reference signal line 304-1 and the second reference signal line 304-2 are different. For example, the voltage values of the first reference signal line 304-1 and the second reference signal line 304-2 differ by 1 V to 5 V.

Or, both the first reference signal line 304-1 and the second reference signal line 304-2 are connected with the same signal input terminal.

It should be noted that, in a case that the thin-film transistors having opposite polarities are employed, or in a case that a current direction during circuit operation changes, the functions of the "source" and the "drain" described above are interchanged in some embodiments of the present specification. Therefore, "source" and "drain" are interchangeable in some embodiments of the present specification, which is not limited in the embodiments of the present disclosure.

In some embodiment, the compensation thin-film transistor T2 is electrically connected with a gate drive terminal, the first node N1, and the third node N3. The compensation thin-film transistor T2 is configured to adjust the potentials of the first node N1 and the third node N3 in response to a gate driving signal. The gate drive terminal is configured to provide the gate driving signal.

The first node N1 is connected with the gate of the third thin-film transistor T3, the drain of the second thin-film transistor T2, the drain of the first thin-film transistor T1, and one terminal of the storage capacitor Cst1.

In summary, a display panel is provided in the embodiments of the present disclosure. The display panel includes: a substrate, and a plurality of first light-emitting devices, a plurality of first pixel drive circuits, a plurality of connecting lines, a plurality of second light-emitting devices and a plurality of second pixel drive circuits disposed on the substrate. The plurality of first light-emitting devices disposed in the light-transmitting display region are coupled to the first pixel drive circuits disposed in the conventional display region through the plurality of connecting lines. An acute angle is provided between an extending direction of at least part of segments of at least one connecting line in the plurality of connecting lines and the first direction, wherein the at least part of segments are disposed in the light-transmitting display region. In this way, the plurality of connecting lines are flexibly arranged by setting up the value of the acute angle, such that the arrangement of the plurality of connecting lines on the display panel is relatively flexible. The problem that the flexibility of the arrangement of the connecting lines corresponding to the first light-emitting devices disposed in the light-transmitting display region is low in the related art is solved, and the flexibility of the arrangement of the connecting lines corresponding to the first light-emitting devices disposed in the light-transmitting display region is improved.

A display apparatus is provided in the embodiments of the present disclosure. The display apparatus is any product or component with a display function, such as a mobile phone, a tablet computer, a television, a display, a notebook computer, a digital photo frame, and a navigator.

In some embodiments, the display apparatus includes: a photosensitive sensor and the display panel as defined in any one of the above embodiments, wherein the photosensitive sensor is an image sensor, a light ray sensor, a distance sensor, or the like in a camera. The image sensor is configured for face recognition, fingerprint recognition, or the like. An orthographic projection of a light inlet surface of the photosensitive sensor on the substrate of the display panel is at least partially disposed in the light-transmitting display region.

The sizes of the layers and regions are exaggerated for clarity of illustration in some accompanying drawings. Also, it is understood that, in a case that an element or layer is referred to as being "on" another element or layer, it is directly on the other element, or an intermediate layer is present. In addition, it is understood that, in a case that an element or layer is referred to as being "under" another element or layer, it is directly under the other element, or one or more intermediate layers or elements are present. In addition, it is also understood that, in a case that a layer or element is referred to as being "between" two layers or elements, it is the only layer between the two layers or elements, or one or more intermediate layers or elements are also present. Like reference numerals refer to like elements throughout the present disclosure.

In the present disclosure, the terms "first," "second" and "third" are merely defined for descriptive purposes and should not be construed as indicating or implying the relative importance. The term "a plurality of" refers to two or more, unless otherwise explicitly defined.

Described above are merely exemplary embodiments of the present disclosure and are not intended to limit the present disclosure. Within the spirit and principle of the present disclosure, any modifications, equivalent substitutions, improvements, and the like are within the protection scope of the present disclosure.

What is claimed is:

1. A display panel, comprising:
a substrate comprising a light-transmitting display region and a conventional display region, wherein the light-transmitting display region is surrounded by at least part of the conventional display region; and
a plurality of first light-emitting devices disposed in the light-transmitting display region, and a plurality of first pixel drive circuits, a plurality of second pixel drive circuits, and a plurality of second light-emitting devices disposed in the conventional display region, the plurality of first pixel drive circuits being coupled to the plurality of first light-emitting devices through a plurality of connecting lines, the plurality of first pixel drive circuits being configured to drive the plurality of first light-emitting devices to emit light, the plurality of second pixel drive circuits being coupled to the plurality of second light-emitting devices, and the plurality of second pixel drive circuits being configured to drive the plurality of second light-emitting devices to emit light;
wherein the light-transmitting display region comprises a plurality of light-transmitting partitions with the same area, the plurality of light-transmitting partitions are disposed around a center of the light-transmitting display region and are divided by a connection line between the center of the light-transmitting display region and an edge of the light-transmitting display region; and
for each of the plurality of light-transmitting partitions,
the light-transmitting partition comprises a parallel connecting region and an oblique connecting region located on one side of the parallel connecting region that is distal from the center;
the at least one connecting line comprises a first trace, wherein the first trace comprises a third segment and a first segment disposed in the light-transmitting display region and a second segment disposed in the conventional display region; the third segment, the first segment, and the second segment are sequentially connected, the third segment is coupled to the first light-emitting device, the second segment is coupled to the first pixel drive circuit; the second segment is extended along a first direction, the third segment is extended along a second direction, the first direction and the second direction being intersected, and an angle between the first segment and the first direction is greater than 0 degree and less than 90 degrees;
the at least one connecting line comprises a second trace, wherein at least part of segments of the second trace that are disposed in the light-transmitting display region are parallel to the first direction; and
the first light-emitting device disposed in the parallel connecting region is coupled to the second trace, and the first light-emitting device disposed in the oblique connecting region is coupled to the first trace.

2. The display panel according to claim 1, wherein the angle between the first segment and the first direction is greater than 30 degrees and less than 70 degrees.

3. The display panel according to claim 1, wherein the angle between the first segment and the first direction is 45 degrees.

4. The display panel according to claim 1, wherein an angle between the first segment and the second segment is greater than 90 degrees.

5. The display panel according to claim 1, wherein a length of a third segment that is coupled to a plurality of first light-emitting devices in one group of first light-emitting devices in the plurality of groups of first light-emitting devices is positively correlated to the shortest distance between the third segment and an edge of the light-transmitting display region.

6. The display panel according to claim 1, wherein the connection line between the center of the light-transmitting display region and the edge of the light-transmitting display region is a symmetry axis of the light-transmitting partition, wherein the symmetry axis is parallel to or perpendicular to the first direction.

7. The display panel according to claim 1, wherein the plurality of first light-emitting devices comprise a plurality of groups of first light-emitting devices, wherein each group of first light-emitting devices in the plurality of groups of first light-emitting devices are extended along a third direction, the plurality of groups of first light-emitting devices are arranged along a fourth direction, and the first direction, the second direction, the third direction and the fourth direction do not coincide; and one group of first light-emitting devices in the plurality of groups of first light-emitting devices comprise at least two light-emitting units arranged along the third direction, the light-emitting unit comprises at least one first light-emitting device, and the at least two light-emitting units are coupled to the connecting lines disposed at different layers.

8. The display panel according to claim 1, wherein an arrangement density of the plurality of second light-emitting devices disposed in the conventional display region is the same as an arrangement density of the plurality of first light-emitting devices disposed in the light-transmitting display region.

9. The display panel according to claim 1, wherein the plurality of first light-emitting devices are one-to-one coupled with the plurality of first pixel drive circuits through the plurality of connecting lines.

10. The display panel according to claim 1, wherein at least two first light-emitting devices in the plurality of first light-emitting devices are coupled to one first pixel drive circuit in the plurality of first pixel drive circuits through at least two of the connecting lines; or one first light-emitting device in the plurality of first light-emitting devices is coupled to at least two first pixel drive circuits in the plurality of first pixel drive circuits through at least two of the connecting lines.

11. A display apparatus, comprising: a photosensitive sensor and a display panel;

wherein the display panel comprises:

a substrate comprising a light-transmitting display region and a conventional display region, wherein the light-transmitting display region is surrounded by at least part of the conventional display region; and a plurality of first light-emitting devices disposed in the light-transmitting display region, and a plurality of first pixel drive circuits, a plurality of second pixel drive circuits, and a plurality of second light-emitting devices disposed in the conventional display region, the plurality of first pixel drive circuits being coupled to the plurality of first light-emitting devices through a plurality of connecting lines, the plurality of first pixel drive circuits being configured to drive the plurality of first light-emitting devices to emit light, the plurality of second pixel drive circuits being coupled to the plurality of second light-emitting devices, and the plurality of second pixel drive circuits being configured to drive the plurality of second light-emitting devices to emit light;

wherein the light-transmitting display region comprises a plurality of light-transmitting partitions with the same area, the plurality of light-transmitting partitions are disposed around a center of the light-transmitting display region and are divided by a connection line between the center of the light-transmitting display region and an edge of the light-transmitting display region; and for each of the plurality of light-transmitting partitions, the light-transmitting partition comprises a parallel connecting region and an oblique connecting region located on one side of the parallel connecting region that is distal from the center;

the at least one connecting line comprises a first trace, wherein the first trace comprises a third segment and a first segment disposed in the light-transmitting display region and a second segment disposed in the conventional display region; the third segment, the first segment, and the second segment are sequentially connected, the third segment is coupled to the first light-emitting device, the second segment is coupled to the first pixel drive circuit;

the second segment is extended along a first direction, the third segment is extended along a second direction, the first direction and the second direction being intersected, and an angle between the first segment and the first direction is greater than 0 degree and less than 90 degrees;

the at least one connecting line comprises a second trace, wherein at least part of segments of the second trace that are disposed in the light-transmitting display region are parallel to the first direction; and the first light-emitting device disposed in the parallel connecting region is coupled to the second trace, and the first light-emitting device disposed in the oblique connecting region is coupled to the first trace; and an orthographic projection of a light inlet surface of the photosensitive sensor on the substrate of the display panel is at least partially disposed in the light-transmitting display region.

* * * * *